(12) United States Patent
Kobayashi

(10) Patent No.: US 10,396,194 B2
(45) Date of Patent: Aug. 27, 2019

(54) SEMICONDUCTOR DEVICE AND METHOD OF MANUFACTURING THEREOF

(71) Applicant: FUJI ELECTRIC CO., LTD., Kawasaki-shi, Kanagawa (JP)

(72) Inventor: Yusuke Kobayashi, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/846,040

(22) Filed: Dec. 18, 2017

(65) Prior Publication Data

US 2018/0182885 A1 Jun. 28, 2018

(30) Foreign Application Priority Data

Dec. 22, 2016 (JP) .................................. 2016-248942

(51) Int. Cl.
H01L 29/78 (2006.01)
H01L 29/423 (2006.01)
H01L 29/16 (2006.01)
H01L 29/66 (2006.01)
H01L 29/10 (2006.01)

(52) U.S. Cl.
CPC ...... *H01L 29/7806* (2013.01); *H01L 29/1095* (2013.01); *H01L 29/1608* (2013.01); *H01L 29/4236* (2013.01); *H01L 29/66068* (2013.01); *H01L 29/7813* (2013.01)

(58) Field of Classification Search
CPC ............ H01L 29/1095; H01L 29/1608; H01L 29/4236; H01L 29/66068; H01L 29/7806; H01L 29/7813; H01L 29/36; H01L 29/365; H01L 21/82493; H01L 21/823885
See application file for complete search history.

(56) References Cited

U.S. PATENT DOCUMENTS

| 2009/0315083 | A1* | 12/2009 | Pan ................... H01L 29/42368 257/280 |
| 2012/0261676 | A1 | 10/2012 | Nakano |
| 2013/0313576 | A1* | 11/2013 | Nakano ............... H01L 29/8611 257/77 |

FOREIGN PATENT DOCUMENTS

| JP | 2011-134910 A | 7/2011 |
| JP | 2016-9712 A | 1/2016 |

\* cited by examiner

*Primary Examiner* — Joseph M Galvin, III
(74) *Attorney, Agent, or Firm* — Rabin & Berdo, P.C.

(57) ABSTRACT

A semiconductor device includes a semiconductor substrate of a first conductivity type, a first semiconductor layer of the first conductivity type, a first semiconductor region of a second conductivity type, a second semiconductor region of the second conductivity type, a third semiconductor region of the first conductivity type, a trench, a first electrode, and a Schottky electrode. Between trenches where the Schottky electrode is provided, a sidewall of each of the trenches is in contact with first semiconductor layer; and between trenches where the first electrode is provided, a sidewall of each of the trenches is in contact with the second semiconductor region and the third semiconductor region. A region of a part of the Schottky electrode faces toward the first semiconductor region in a depth direction and the trench faces the first semiconductor region in the depth direction.

13 Claims, 19 Drawing Sheets

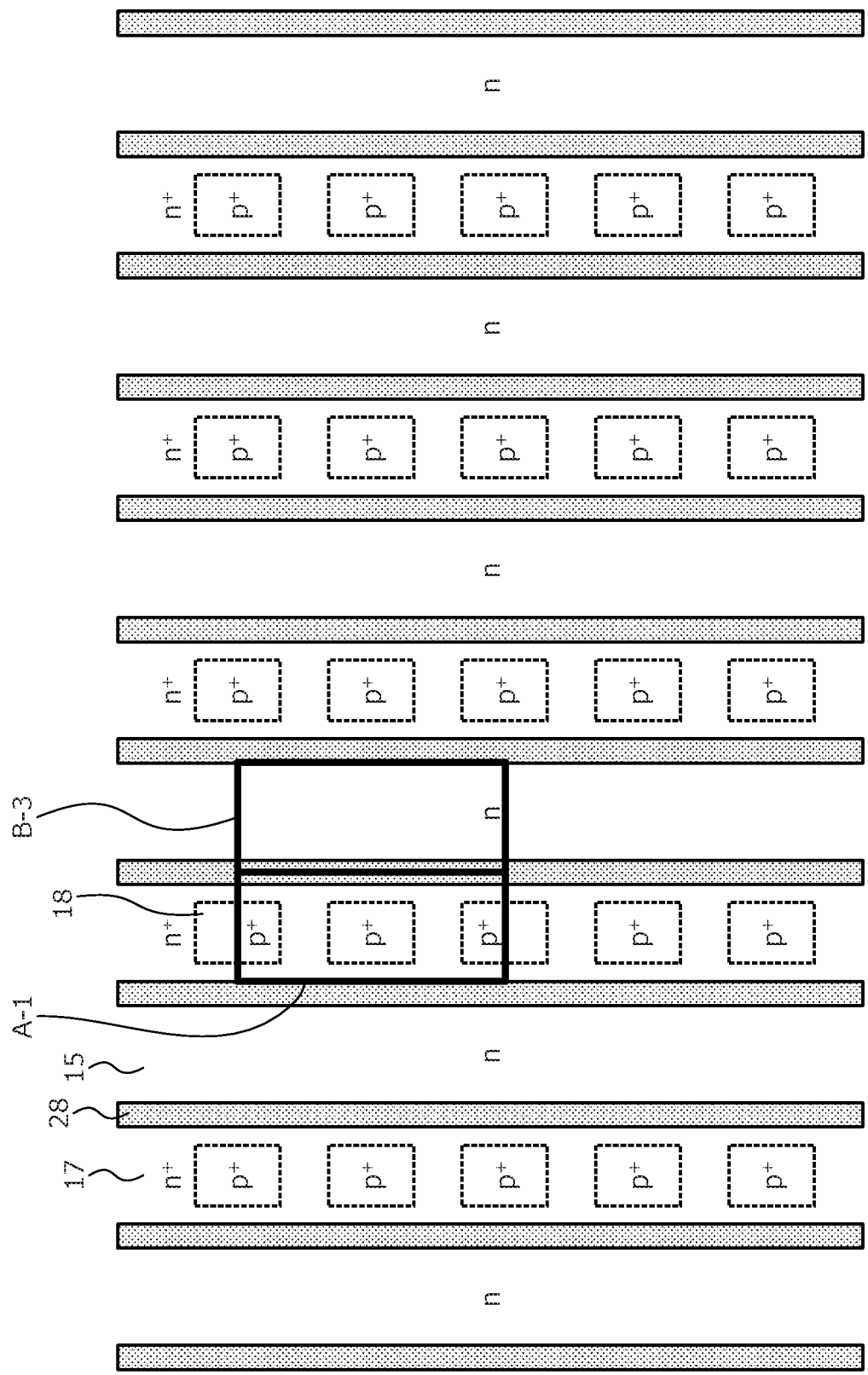

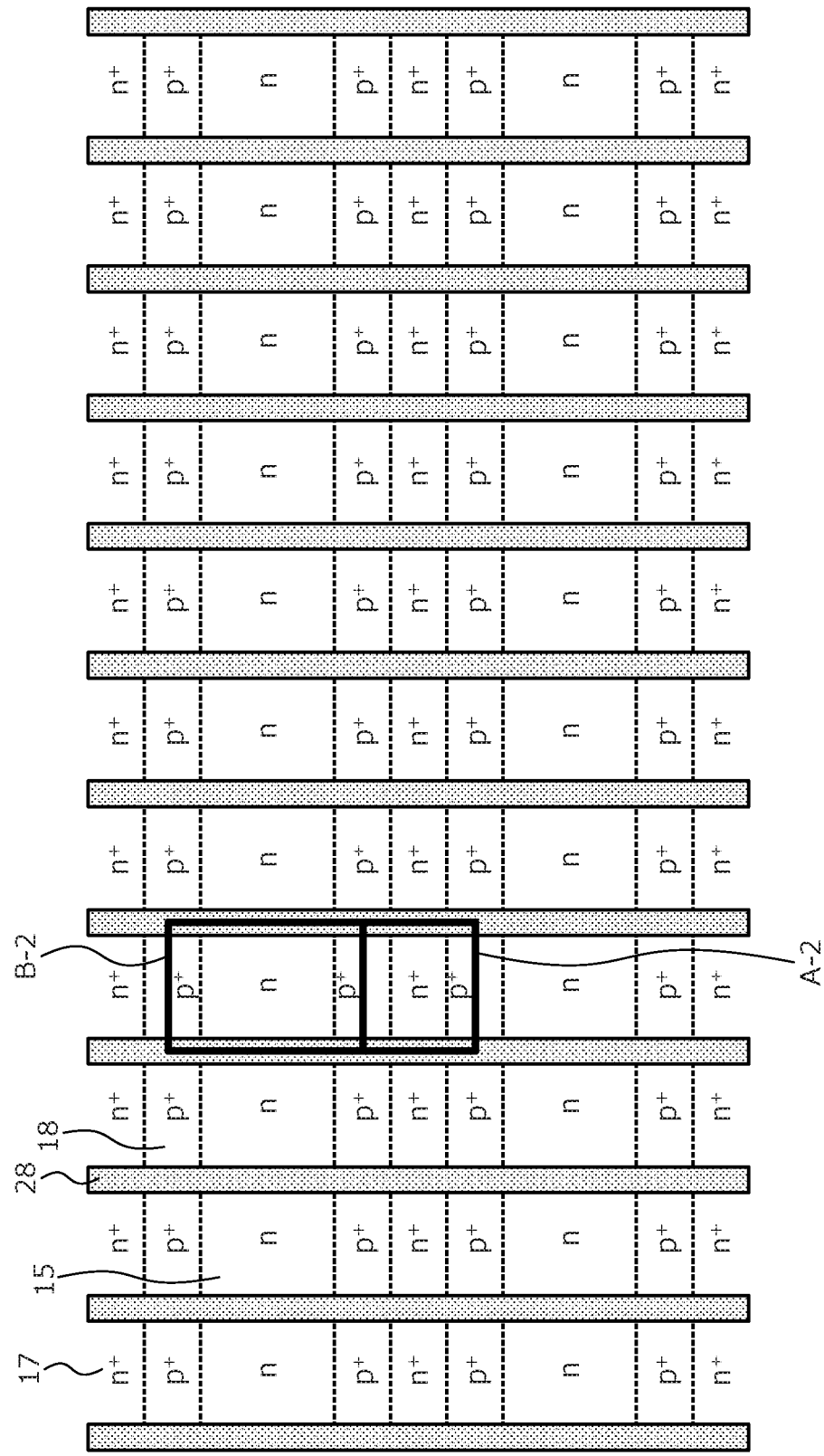

SEMICONDUCTOR DEVICE AND METHOD OF MANUFACTURING THEREOF

CROSS REFERENCE TO RELATED APPLICATIONS

This application is based upon and claims the benefit of priority of the prior Japanese Patent Application No. 2016-248942, filed on Dec. 22, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Metal oxide semiconductor field effect transistors (MOSFETs) sustaining breakdown voltages of 400V, 600V, 900V, 1200V, 1700V, 3300V, 6500V, or higher are commonly known power semiconductor devices. For example, MOSFETs (hereinafter, SiC-MOSFETs) that use a silicon carbide (SiC) semiconductor material are employed in power converting equipment such as converters and inverters. In addition to low loss and high efficiency, reduced leak current at the time of turn OFF, size reductions (decreased chip size), and improved reliability are demanded of these power semiconductor devices.

In power semiconductor devices, to facilitate reductions in element ON resistance, vertical MOSFETs having a trench structure are fabricated (manufactured). In a vertical MOSFET, the cell density per unit surface area may be increased to a greater extent with a trench structure in which a channel is formed orthogonally with respect to the substrate surface as compared to a planar structure in which the channel is formed parallel to the substrate surface and therefore, from the perspective of cost, is advantageous.

The vertical MOSFET has a built-in parasitic pn diode formed by a p-type base region and an n-type drift region as a body diode between the source and drain. Therefore, a free wheeling diode (FWD) used in an inverter may be omitted, contributing to reductions in cost and size. Nonetheless, when a silicon carbide substrate is used as a semiconductor substrate, the parasitic pn diode has a high built-in potential as compared to a case where a silicon (Si) substrate is used and therefore, the ON resistance of the parasitic pn diode is high, leading to increases in loss. Further, when the parasitic pn diode turns ON and is energized, characteristics change over time (aging) and reliability of the semiconductor device decreases due to bipolar operation of the parasitic pn diode.

Regarding the problems above, description will be given taking, as an example, a conventional trench-type SiC-MOSFET having a deep p$^+$-type region between adjacent gate trenches and at bottoms of the gate trenches. A gate trench is a trench in which a gate electrode is embedded via a gate insulating film. Hereinafter, a gate trench will be indicated as a trench. The deep p$^+$-type region is a deep p-type region having an impurity concentration that is higher than an impurity concentration of a p-type base layer used as a channel. The deep p$^+$-type region below the trench is connected to the p$^+$-type region between trenches in a longitudinal direction.

A structure of the conventional trench-type SiC-MOSFET (hereinafter, first conventional example) will be described. FIG. 19 is a cross-sectional view of a configuration of the conventional silicon carbide semiconductor device. FIG. 20 is a plan view of the configuration of the conventional silicon carbide semiconductor device. FIG. 20 is a plan view at line C-C' in FIG. 19. As depicted in FIG. 19, the first conventional example has, in an active region, a trench-type MOS gate (insulated gate constituted by a metal-oxide-film semiconductor material) structure and a deep p$^+$-type region 103 in a front surface of an n-type semiconductor substrate. The active region is a region responsible for current driving when the gate is on. In particular, the n-type semiconductor substrate is formed by forming, by epitaxial growth, an n$^-$-type silicon carbide epitaxial layer 101 constituting an n-type drift layer on an n$^+$-type silicon carbide substrate 102 constituting an n$^+$-type drain layer. On a front surface side of the n-type semiconductor substrate, a MOS gate structure constituted by a p-type base region 1016, an n$^+$-type source region 1017, a trench 1028, a gate insulating film 1019, and a gate electrode 1020 is provided.

At a bottom of the trench 1028, a p$^+$-type region 103 is provided so as to cover a lower part of the trench 1028 to mitigate the electric field applied to the gate insulating film 1019. Electric field concentrates at the p$^+$-type region 103 provided at the lower part of the trench 1028 and to prevent decreases in the breakdown voltage, a depth of the p$^+$-type region 103 between adjacent trenches 1028 (mesa part) is deeper at least at one part than a depth of the trenches 1028.

Further, the n$^+$-type source region 1017 and the p-type base region 1016 are exposed at a contact hole penetrating an interlayer insulating film 1021 in a depth direction. A source electrode 1023 is provided as a front electrode so as to be embedded in the contact hole. The source electrode 1023 is in contact with the p-type base region 1016 and the n$^+$-type source region 1017. On a rear surface of the n-type semiconductor substrate, a drain electrode (not depicted) is provided as a rear electrode.

Here, when positive voltage is applied to the source electrode 1023 and negative voltage is applied to the drain electrode (when the MOSFET is OFF), a pn junction between the p-type base region 1016 and the n$^-$-type silicon carbide epitaxial layer 101 is forward biased. In the first conventional example, when the MOSFET is OFF and a parasitic pn diode formed by the p-type base region 1016 and the n$^-$-type silicon carbide epitaxial layer 101 is turned ON and energized, time-related degradation occurs due to bipolar operation of the parasitic pn diode. Further, when the parasitic pn diode is used as a freewheeling diode, since a silicon carbide substrate is used, the ON resistance increases. This problem is resolved by incorporating a built-in parasitic Schottky diode as a body diode between the source and drain (for example, refer to Japanese Laid-Open Patent Publication No. 2011-134910). Further, a structure has been proposed in which between V-type trenches, both a planar parasitic Schottky diode and a channel region in a direction orthogonal to the trenches are provided and a p-type layer embedded in a lower part of the parasitic Schottky diode is provided to suppress parasitic Schottky leak current (for example, refer to Japanese Laid-Open Patent Publication No. 2016-009712).

A silicon carbide semiconductor material has a breakdown field strength that is high with respect to avalanche breakdown as compared to a silicon semiconductor material and therefore, a parasitic Schottky diode may be used as a body diode even in high-voltage devices of 600V or higher. In particular, the parasitic Schottky diode is provided in parallel with the parasitic pn diode between the source and drain, and the parasitic Schottky diode is designed to turn ON before the parasitic pn diode turns on when the MOSFET is OFF. As a result, time-related degradation due to the bipolar operation of the parasitic pn diode may be prevented. Further, the parasitic Schottky diode has no built-in pn junction potential and therefore, as a body diode, compared to a case in which only a parasitic pn diode is formed, a low ON resistance may be expected.

Further, from the perspective of improved MOSFET performance, although shortening of the cell pitch is desirable, incorporation of the built-in parasitic Schottky diode interferes with the shortening of the cell pitch and therefore, is undesirable. Further, when a parasitic Schottky diode is used as a freewheeling diode, it is desirable to be able to freely change the resistance ratio of the MOSFET and the parasitic Schottky diode according to use.

SUMMARY OF THE INVENTION

According to an embodiment of the present invention, a semiconductor device includes a semiconductor substrate of a first conductivity type; a first semiconductor layer of the first conductivity type provided on a front surface of the semiconductor substrate, an impurity concentration of a first sub-layer of the first semiconductor layer being lower than an impurity concentration of the semiconductor substrate; a first semiconductor region of a second conductivity type selectively provided in the first semiconductor layer, an impurity concentration of the first semiconductor region being higher than the impurity concentration of the first sub-layer of the first semiconductor layer; a second semiconductor region of the second conductivity type selectively provided in a first side of the first semiconductor layer opposite a second side of the first semiconductor layer, the second side facing the semiconductor substrate, an impurity concentration of the second semiconductor region being lower than the impurity concentration of the first semiconductor region; a third semiconductor region of the first conductivity type selectively provided in the first semiconductor layer, an impurity concentration of the third semiconductor region being higher than the impurity concentration of the first semiconductor layer; a trench penetrating the third semiconductor region and the second semiconductor region, and reaching the first semiconductor region; a gate electrode provided in the trench, via a gate insulating film; a first electrode in contact with the first semiconductor region and the third semiconductor region; and a Schottky electrode in contact with a second sub-layer of the first semiconductor layer. Between the trench and a first adjacent trench, where the Schottky electrode is provided, a first sidewall of the trench is in contact with the first semiconductor layer. Between the trench and a second adjacent trench, where the first electrode is provided, a second sidewall of the trench is in contact with the second semiconductor region and the third semiconductor region. At least a part of a region of the Schottky electrode faces the first semiconductor region in a depth direction. The trench faces the first semiconductor region in the depth direction.

In the embodiment, the semiconductor device further includes a second semiconductor layer of the first conductivity type selectively provided on the first side of the first semiconductor layer, an impurity concentration of the second semiconductor layer being higher than the impurity concentration of the first semiconductor layer. Between the trench and the first adjacent trench, where the Schottky electrode is provided, the first sidewall of the trench is in contact with the second semiconductor layer. The Schottky electrode is in contact with the second semiconductor layer.

In the embodiment, the semiconductor device further includes a third semiconductor layer of the first conductivity type provided between the first semiconductor layer and the second semiconductor layer, an impurity concentration of the third semiconductor layer being higher than the impurity concentration of the second semiconductor layer. Between the trench and the first adjacent trench, where the Schottky electrode is provided, the first sidewall of the trench is in contact with the second semiconductor layer and the third semiconductor layer.

In the embodiment, between the trench and the first adjacent trench, where the Schottky electrode is provided, the first sidewall of the trench is in contact with the first semiconductor layer and the second semiconductor region.

In the embodiment, a first region between the trench and the first adjacent trench, where the Schottky electrode is provided, and a second region between the trench and the second adjacent trench, where the first electrode is provided, are arranged as a unit cell.

In the embodiment, an area of the first region is greater than an area of the second region.

In the embodiment, the first region and the second region are arranged in a striped shape.

In the embodiment, at least one part of the first semiconductor region is in contact with the trench.

In the embodiment, the first semiconductor region includes a plurality of first semiconductor regions separated from each other by a distance of 0.8 µm to 1.2 µm in a width direction of the trench.

In the embodiment, an end of the first semiconductor region toward the semiconductor substrate is positioned closer than a bottom of the trench to the semiconductor substrate. An end of the first semiconductor region toward the first electrode is separated by a distance of 0.4 µm to 1.9 µm from a surface of the third semiconductor region.

In the embodiment, the trench is separated by a distance of at most 6 µm in a width direction of the trench and is arranged at a constant interval.

In the embodiment, an impurity concentration of a region from a surface of the first semiconductor layer in contact with the Schottky electrode to a depth of 0.1 µm is $1.0 \times 10^{16}$ to $1.0 \times 10^{18}/cm^3$.

In the embodiment, the Schottky electrode and the first electrode are formed from a same material.

According to another embodiment of the present invention, a method of manufacturing a semiconductor device, includes selectively forming a first semiconductor layer of a first conductivity type on a front surface of a semiconductor substrate of the first conductivity type front surface, an impurity concentration of a first sub-layer of the first semiconductor layer being lower than an impurity concentration of the semiconductor substrate; selectively forming a first semiconductor region of a second conductivity type in the first semiconductor layer, an impurity concentration of the first semiconductor region being higher than the impurity concentration of the first sub-layer of the first semiconductor layer; selectively forming a second semiconductor region of the second conductivity type in a first side of the first semiconductor layer opposite a second side of the first semiconductor layer, the second side facing the semiconductor substrate, an impurity concentration of the second semiconductor region being lower than the impurity concentration of the first semiconductor region; selectively forming a third semiconductor region of the first conductivity type in the first semiconductor layer, an impurity concentration of the third semiconductor region being higher than the impurity concentration of the first semiconductor region; forming a trench that penetrates the third semiconductor region and the second semiconductor region, and reaches the first semiconductor region; forming a gate electrode in the trench, via a gate insulating film; forming a first electrode in contact with the first semiconductor region and the third semiconductor region; and forming a Schottky electrode in contact with the first semiconductor layer. The trench is formed so that between the trench and a first adjacent trench, where the Schottky electrode is provided, a first sidewall of the trench is in contact with the first semiconductor layer, and between the trench and a second adjacent trench, where the first electrode is provided, a second sidewall of the trench is in contact with the second semiconductor region and the third semiconductor region, the trench being further formed to face the first semiconductor region in a depth direction. At least a part of a region of the Schottky electrode is formed to face the first semiconductor region in the depth direction.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a plan view of a configuration of the silicon carbide semiconductor device according to the first embodiment;

FIG. 4 is another plan view of a configuration of the silicon carbide semiconductor device according to the first embodiment;

DETAILED DESCRIPTION OF THE INVENTION

Figure 1:
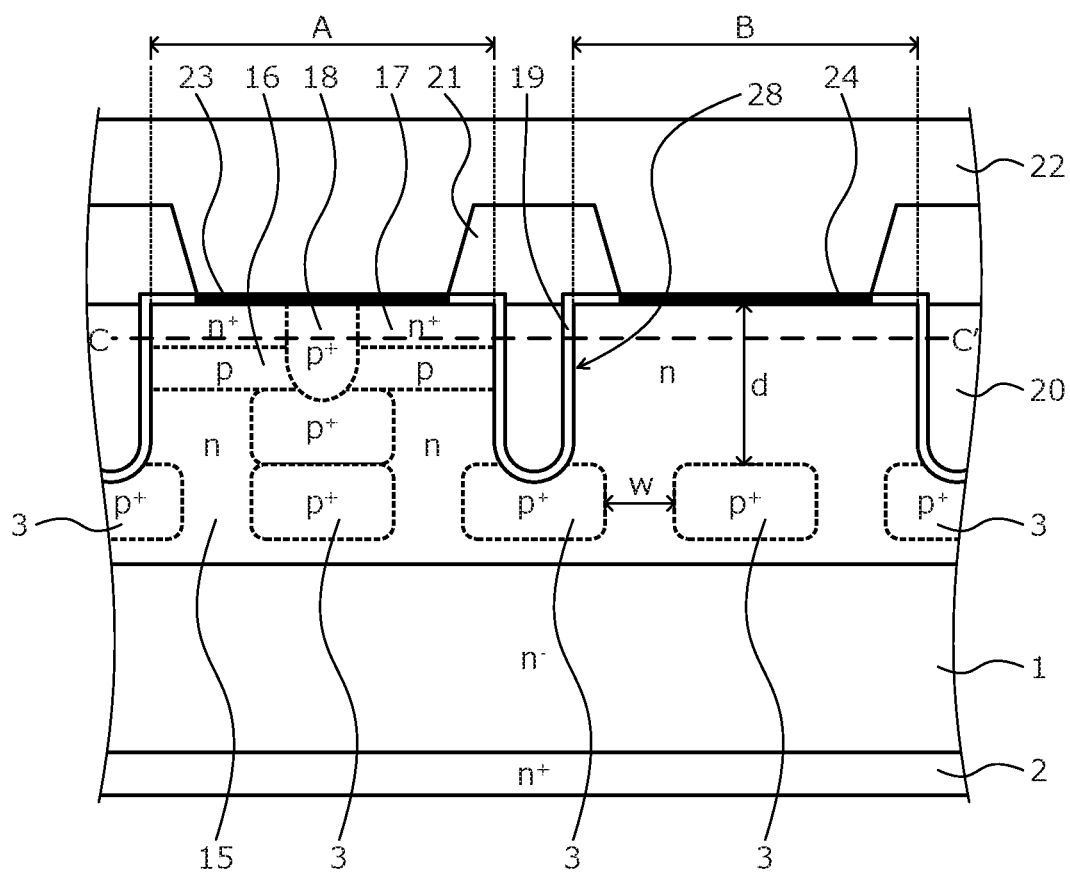
FIG. 1 is a cross-sectional view of a configuration of a silicon carbide semiconductor device according to a first embodiment.

First, problems associated with the conventional techniques will be discussed. In Japanese Laid-Open Patent Publication No. 2011-134910, a problem arises in that when the MOSFET is OFF, high electric field is applied to a Schottky junction formed at a bottom of a contact trench, whereby a large leak current flows via the Schottky junction. The contact trench is a trench that is covered by a Schottky metal connecting an inner wall and a source electrode, forming a Schottky junction between a semiconductor region exposed at the inner wall and the Schottky metal. Further, in Japanese Laid-Open Patent Publication No. 2016-009712, shortening the distance between gate trenches to improve MOSFET performance is difficult. A further problem exists in that the ratio of the resistance at the time of forward biasing of the parasitic Schottky diode and the resistance when the MOSFET is ON cannot be changed.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

The semiconductor device according to an embodiment is configured using a wide bandgap semiconductor material. In the embodiments, a MOSFET will be described as an example of a silicon carbide semiconductor device fabricated using, for example, SiC as a wide bandgap semiconductor material. FIG. 1 is a cross-sectional view of a configuration of the silicon carbide semiconductor device according to the first embodiment.

As depicted in FIG. 1, in the silicon carbide semiconductor device according to the first embodiment, an n$^-$-type silicon carbide epitaxial layer (first semiconductor layer of a first conductivity type) 1 is deposited on a first main surface (front surface), for example, (0001) plane, (Si face) of an n$^+$-type silicon carbide substrate (semiconductor substrate of the first conductivity type) 2.

The n$^+$-type silicon carbide substrate 2 is a silicon carbide single-crystal substrate doped with, for example, nitrogen (N). The n$^-$-type silicon carbide epitaxial layer 1 has an impurity concentration that is lower than an impurity concentration of the n$^+$-type silicon carbide substrate 2 and the n$^-$-type silicon carbide epitaxial layer 1 is a low-concentration n$^-$-type drift layer doped with, for example, nitrogen. An n-type high-concentration region 15 is formed in a surface of the n$^-$-type silicon carbide epitaxial layer 1, on a first side of the n$^-$-type silicon carbide epitaxial layer 1 opposite a second side of the n$^-$-type silicon carbide epitaxial layer 1, the second side facing the n$^+$-type silicon carbide substrate 2. The n-type high-concentration region 15 is a high-concentration n-type drift layer doped with, for example, nitrogen, and has an impurity concentration that is lower than the impurity concentration of the n$^+$-type silicon carbide substrate 2 and higher than an impurity concentration of the n$^-$-type silicon carbide epitaxial layer 1. Hereinafter, the n$^+$-type silicon carbide substrate 2, the n$^-$-type silicon carbide epitaxial layer 1, the n-type high-concentration region 15, and a p-type base region (second semiconductor region of the second conductivity type) 16 described hereinafter are collectively regarded as a silicon carbide semiconductor base. In the present specification and claims, the reference numerals 1 and 15 both refer to regions of a same semiconductor layer, such that the layers are formed at the same time to have the same impurity concentration. During processing, the region 15 may be doped to have a different impurity concentration. Accordingly, in the present specification and claims, the region 1 may be referred to as either the first semiconductor layer or as a "first sub-layer" of the first semiconductor layer, and the region 15 may be referred to as an n-type high concentration region or as a "second sub-layer" of the first semiconductor layer.

Further, on a second main surface (rear surface, i.e., rear surface of the silicon carbide semiconductor base) of the n$^+$-type silicon carbide substrate 2, a non-depicted rear electrode (drain electrode) is provided. The rear electrode constitutes a drain electrode. On a surface of the rear electrode, a drain electrode pad (not depicted) is provided.

A trench structure is formed in the first main surface side of the silicon carbide semiconductor base (the p-type base region 16 side). In particular, a trench 28 penetrates the p-type base region 16 from a surface of the p-type base region 16, the surface on a first side (the first main surface side of the silicon carbide semiconductor base) of the p-type base region 16 opposite a second side of the p-type base region 16 facing toward the n$^+$-type silicon carbide substrate 2. The trench 28 reaches the n-type high-concentration region 15. Along an inner wall of the trench 28, a gate insulating film 19 is formed on a sidewall and bottom of the trench, and a gate electrode 20 is formed on the gate insulating film 19 in the trench 28. The gate electrode 20 is insulated from the n$^-$-type silicon carbide epitaxial layer 1 and the p-type base region 16 by the gate insulating film 19.

A part of the gate electrode 20 may protrude from a top (side facing a source electrode pad 22) of the trench 28 toward the source electrode pad 22.

A p$^+$-type region (first semiconductor region of a second conductivity type) 3 is selectively provided in the n-type high-concentration region 15. The p$^+$-type region 3 is provided between adjacent trenches 28 and below the trenches 28. The p$^+$-type region 3 between the trenches 28 is in contact with the p-type base region 16, is separate from the trenches 28, and reaches a deep position closer to a drain that the bottoms of the trenches 28. Further, each of the p$^+$-type regions 3 below the trenches 28 is formed at a position facing the bottom of the trench 28 in the depth direction. A width of the p$^+$-type region 3 is a same as or wider than a width of the trench 28. The bottom of the trench 28 may reach the p$^+$-type region 3 that is below the trench 28, or may be positioned in the n-type high-concentration region 15 between the p-type base region 16 and the p$^+$-type region 3.

The p$^+$-type region 3 is doped with, for example, aluminum (Al). A part of the p$^+$-type region 3 between the trenches 28 may be extended toward the trench, forming a structure where the p$^+$-type region 3 between the trenches 28 and the p$^+$-type region 3 below the trench 28 are connected.

In the silicon carbide semiconductor device according to the first embodiment, regions between adjacent trenches 28 are separated into a region A and a region B. In the region A of a base first main surface side of the n$^-$-type silicon carbide epitaxial layer 1, the p-type base region 16 is provided. The p-type base region 16 is in contact with the p$^+$-type region 3 between the trenches 28. In the p-type base region 16, on the base first main surface side, an n$^+$-type source region 17 and a p$^+$-type contact region 18 (together defining a third semiconductor region of the first conductivity type) are selectively provided. Further, the n$^+$-type source region 17 and the p$^+$-type contact region 18 are in contact with each other. In the region A, a sidewall of the trench 28 is in contact with the n-type high-concentration region 15, the p-type base region 16, and the n$^+$-type source region 17. Further, the sidewall the trench 28 may be in contact with the p$^+$-type contact region 18 (refer to A-2 in FIG. 2C).

In the region B of the base first main surface side of the n$^-$-type silicon carbide epitaxial layer 1, the p-type base region 16, the n$^+$-type source region 17, and the p$^+$-type contact region 18 are not provided and a sidewall of the trench 28 is in contact with the n-type high-concentration region 15. Further, the sidewall of the trench 28 may be in contact with the p$^+$-type contact region 18 (refer to B-2 in FIG. 2E).

An interlayer insulating film 21 is provided on the entire first main surface side of the silicon carbide semiconductor base so as to cover the gate electrode 20 embedded in the trench 28. In the region A of the base first main surface side, a source electrode (first electrode) 23 is provided. The source electrode 23 is in contact with the n$^+$-type source region 17 and the p$^+$-type contact region 18, via a contact hole in the interlayer insulating film 21. The source electrode 23 is electrically insulated from the gate electrode 20, by the interlayer insulating film 21. On the source electrode 23, the source electrode pad 22 is provided.

Further, in the region B of the base first main surface side, a Schottky electrode 24 is provided. The Schottky electrode 24 is in contact with the n-type high-concentration region 15, via a contact hole in the interlayer insulating film 21. The Schottky electrode 24 is electrically insulated from the gate electrode 20, by the interlayer insulating film 21. The Schottky electrode 24 of the region B is provided at a position shallower than the trench 28 and the p$^+$-type region 3 is provided via the n-type high-concentration region 15 in the depth direction of a parasitic Schottky diode. Further, the p$^+$-type region 3 may be connected with the p-type base region 16. Additionally, the source electrode 23 and the Schottky electrode 24 may be formed using a same material.

Depths of the Schottky electrode 24 and the p$^+$-type region 3 may be shallow because resistance of the Schottky diode may be reduced. Further, to accommodate electric field mitigation of the gate insulating film 19, an upper end of the p$^+$-type region 3 may be provided at a position shallower than the trench 28 formed having a length that is a depth of about 0.5 μm to 2.0 μm, for example, may be provided at a position so that a depth d from a semiconductor base surface is 0.4 μm to 1.9 μm. Further, some of the p$^+$-type regions 3 may be arranged so that the upper ends of the p$^+$-type regions 3 cover some of the trenches 28. Further, a distance w separating and between adjacent p$^+$-type regions 3 may be 0.8 μm to 1.2 μm from a perspective of parasitic JFET (Junction FET) resistance and electric field protection in the OFF state.

Due to a characteristic of an ohmic contact being formed when an impurity concentration of the n-type high-concentration region 15 of the surface of the Schottky electrode 24 is too high, the n-type high-concentration region 15 that is within 0.1 μm from the semiconductor base surface may have an impurity concentration of $1.0 \times 10^{16}$ to $1.0 \times 10^{18}/cm^3$, which is at least equal to the impurity concentration of the n$^-$-type silicon carbide epitaxial layer 1 and at most equal to a concentration forming an ohmic electrode. As a result, in the OFF state, the Schottky diode part is protected by a parasitic junction FET caused by a depletion layer spreading from the deep p$^+$-type region 3, the electric field may be mitigated and the leak current in the OFF state may be reduced.

In FIG. 1, while only two trench MOS structures are depicted, numerous trench structured MOS gate (insulated gate constituted by a metal-oxide-film semiconductor material) structures may be further arranged in parallel.

In this manner, in the first embodiment, the region A responsible for MOSFET driving between the trenches 28 and the region B responsible for Schottky diode operation are provided. The region A has a similar structure as the MOSFET of the first conventional example and therefore, the degree of difficulty of shortening cell pitch does not change. The structure between the gate trenches in the region B is simpler than the structure in the region A and therefore, shortening of the cell pitch is also easier than in the region A.

For example, when the cell pitch is 6 μm or less, formation of both a channel region and a parasitic Schottky diode between the trenches 28, in a direction orthogonal to the trenches 28 is difficult. However, in the first embodiment, even when the cell pitch is made less than 6 μm, since the region A responsible for MOSFET driving and the region B responsible for Schottky diode operation are separated, formation of a Schottky diode and a channel region is possible.

Further, in the first embodiment, by changing the area ratio of the region A and the region B, the ratio of MOSFET resistance and the Schottky diode resistance may be arbitrarily adjusted. The Schottky diode resistance is smaller than the MOSFET resistance and therefore, the area of the region B may be smaller than the area of the region A (B/A<1).

Figure 2A:
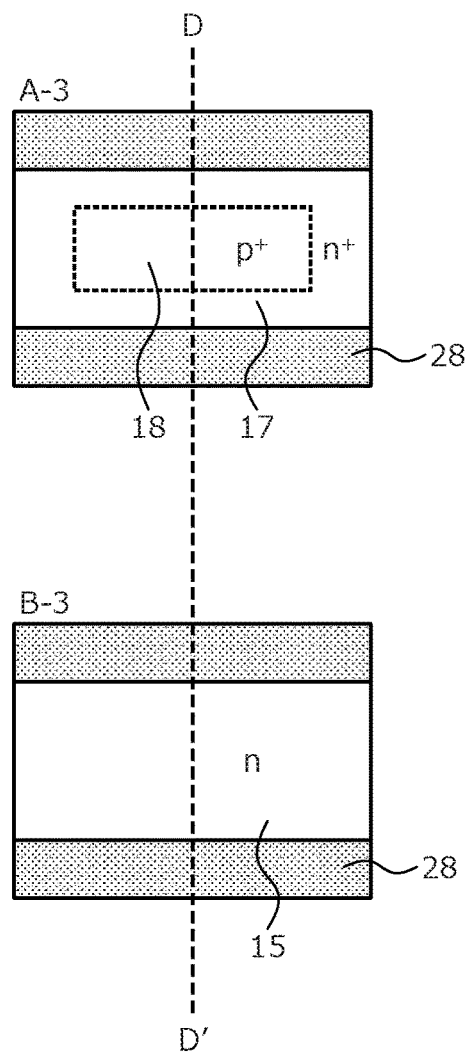
FIG. 2A is a plan view of a unit cell of the silicon carbide semiconductor device according to the first embodiment.
Figure 2B:
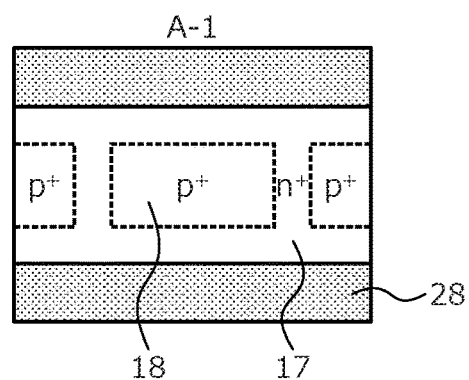
FIG. 2B is a plan view of a unit cell of the silicon carbide semiconductor device according to the first embodiment.
Figure 2C:
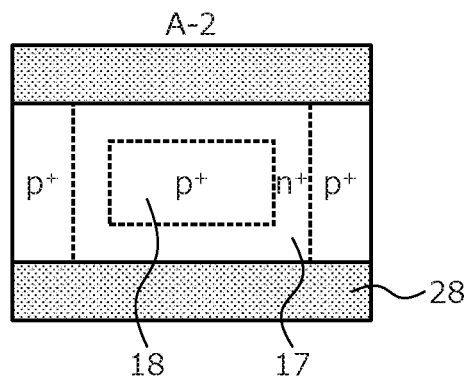
FIG. 2C is a plan view of a unit cell of the silicon carbide semiconductor device according to the first embodiment.
Figure 2D:
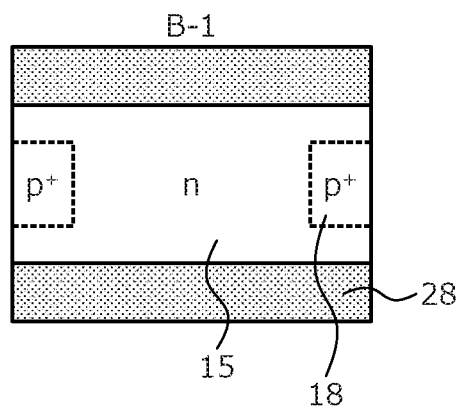
FIG. 2D is a plan view of a unit cell of the silicon carbide semiconductor device according to the first embodiment.
Figure 2E:
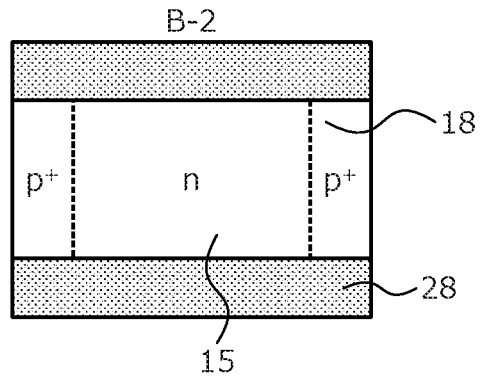
FIG. 2E is a plan view of a unit cell of the silicon carbide semiconductor device according to the first embodiment.

FIGS. 2A, 2B, 2C, 2D, and 2E are plan views of unit cells of the silicon carbide semiconductor device according to the first embodiment. FIG. 2A is a plan view at line C-C' in FIG. 1. In FIG. 2A, A-3 and B-3 are unit cells of the silicon carbide semiconductor device in FIG. 1. Here, FIG. 1 is a cross-sectional view at line D-D' of A-3 and B-3 in FIG. 2A. Further, A-1, A-2, B-1, and B-2 in FIGS. 2B, 2C, 2D, and 2E, respectively, are unit cells in which the arrangement of the p$^+$-type contact region 18 of the silicon carbide semiconductor device in FIG. 1 has been changed. The silicon carbide semiconductor device may have a structure in which one among the unit cells A-1 to A-3 is selected arbitrarily and one among the unit cells B-1 to B-3 is selected arbitrarily.

FIG. 3 is a plan view of a configuration of the silicon carbide semiconductor device according to the first embodiment. FIG. 4 is another plan view of a configuration of the silicon carbide semiconductor device according to the first embodiment. Here, FIG. 3 is an example of structure in which the unit cells A-1 and B-3 in FIGS. 2B and 2A, respectively, are selected and arranged. FIG. 4 is an example of a structure in which the unit cells A-2 and B-2 in FIGS. 2C and 2E, respectively, are selected and arranged.

Figure 5:
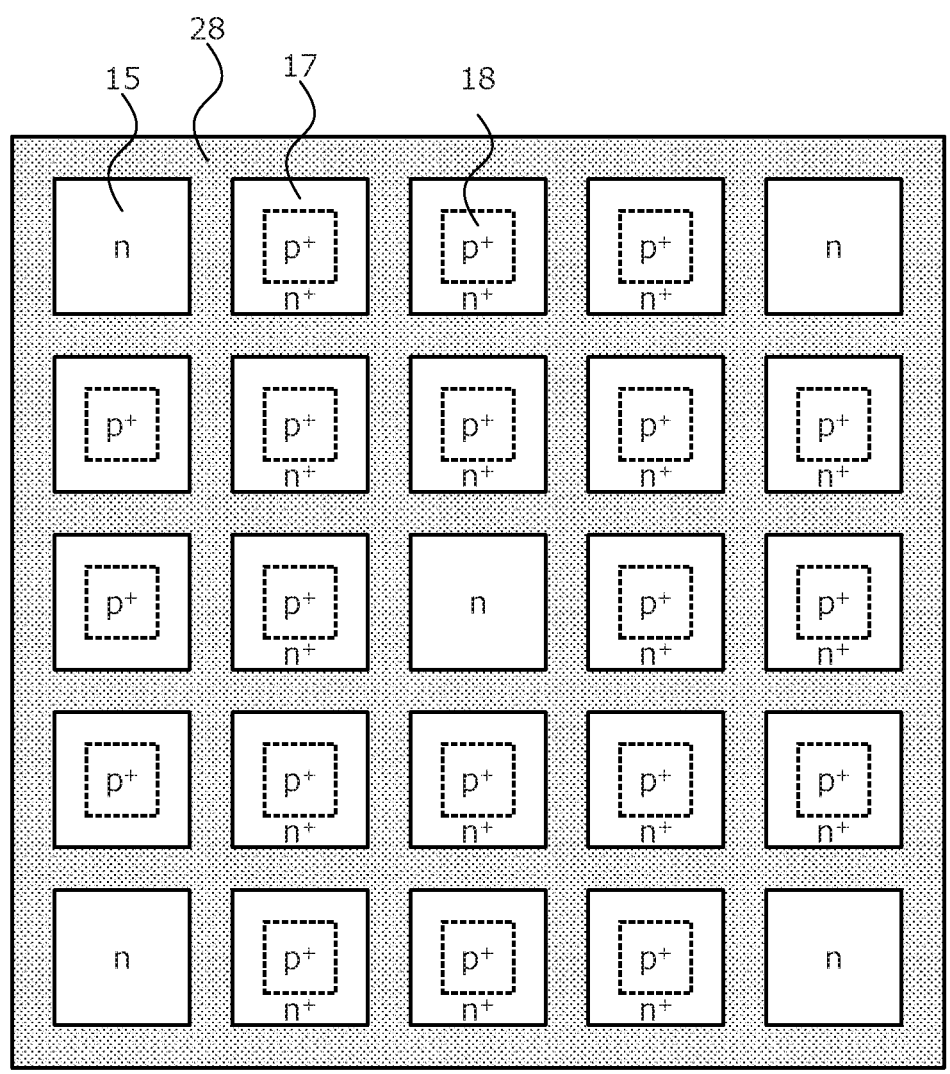
FIG. 5 is a plan view of a configuration of another cell structure of the silicon carbide semiconductor device according to the first embodiment.
Figure 6:
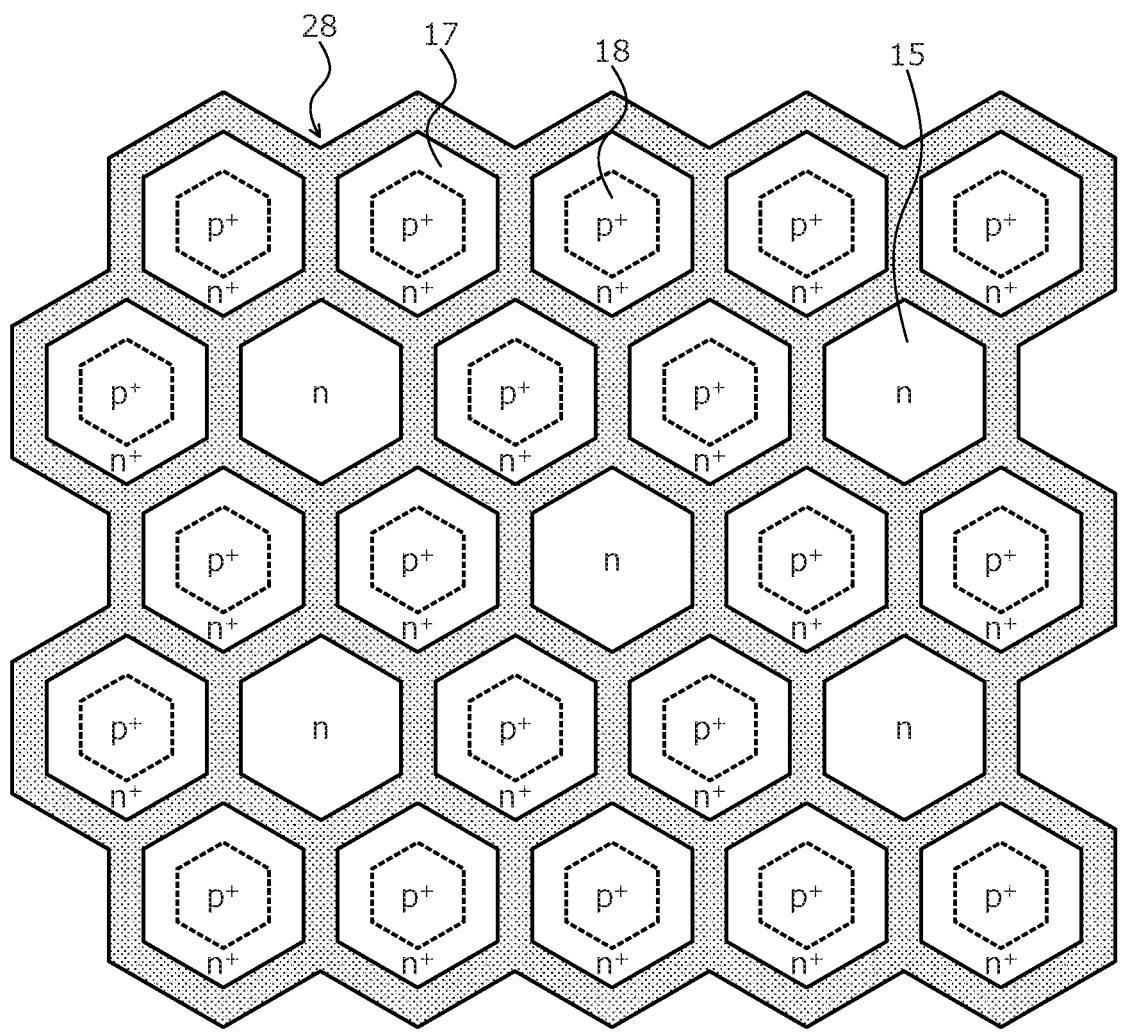
FIG. 6 is a plan view of a configuration of another cell structure of the silicon carbide semiconductor device according to the first embodiment.

While FIGS. 3 and 4 depict a silicon carbide semiconductor device having a cell structure that is a striped structure, the present invention is further applicable to silicon carbide semiconductor devices having other cell structures. FIG. 5 is a plan view of a configuration of another cell structure of the silicon carbide semiconductor device according to the first embodiment. FIG. 6 is a plan view of a configuration of another cell structure of the silicon carbide semiconductor device according to the first embodiment. When the cell structure is a square as depicted in FIG. 5, or when the cell structure is a hexagon as depicted in FIG. 6, or even when the trench-type MOSFET has polygonal cells, by separating the regions surrounded by the trenches 28 into the region A and the region B, similar effects may be expected.

Figure 7:
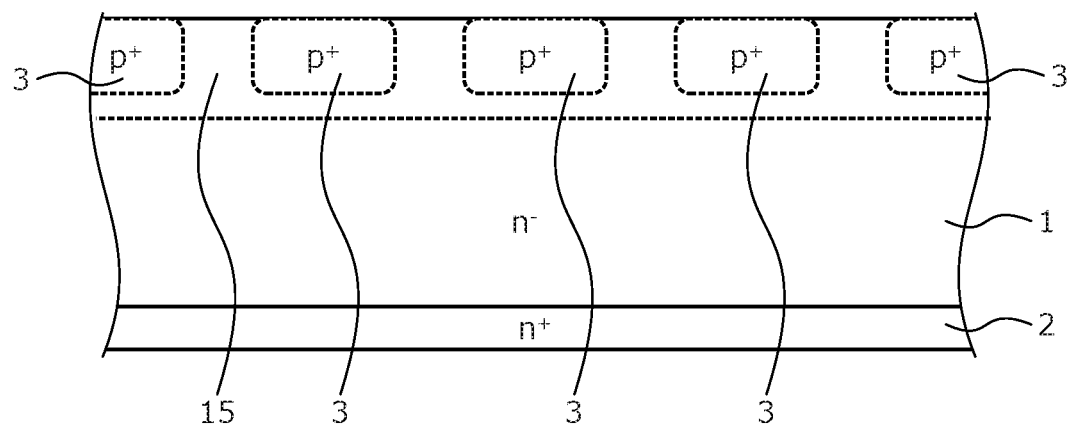
FIG. 7 is a cross-sectional view of the silicon carbide semiconductor device according to the first embodiment during manufacture.
Figure 8:
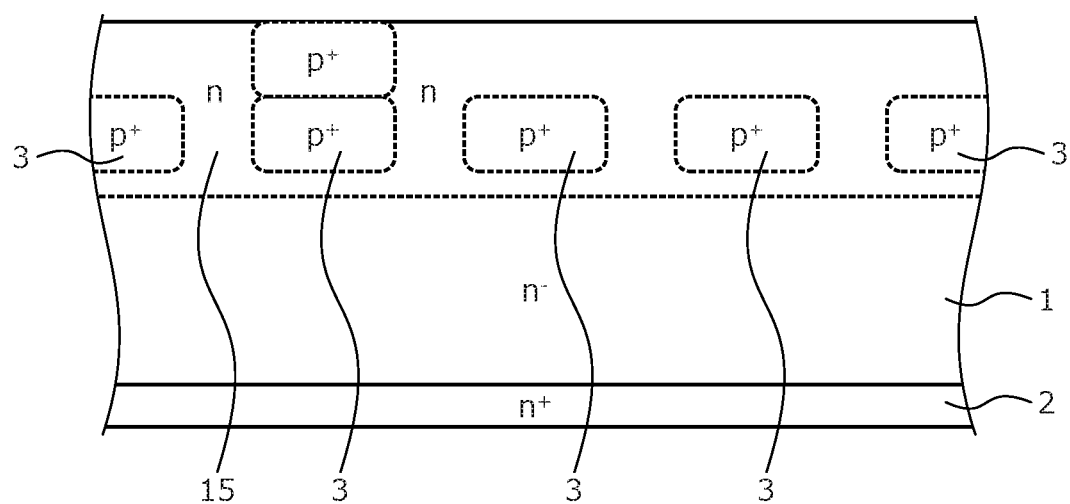
FIG. 8 is a cross-sectional view of the silicon carbide semiconductor device according to the first embodiment during manufacture.
Figure 9:
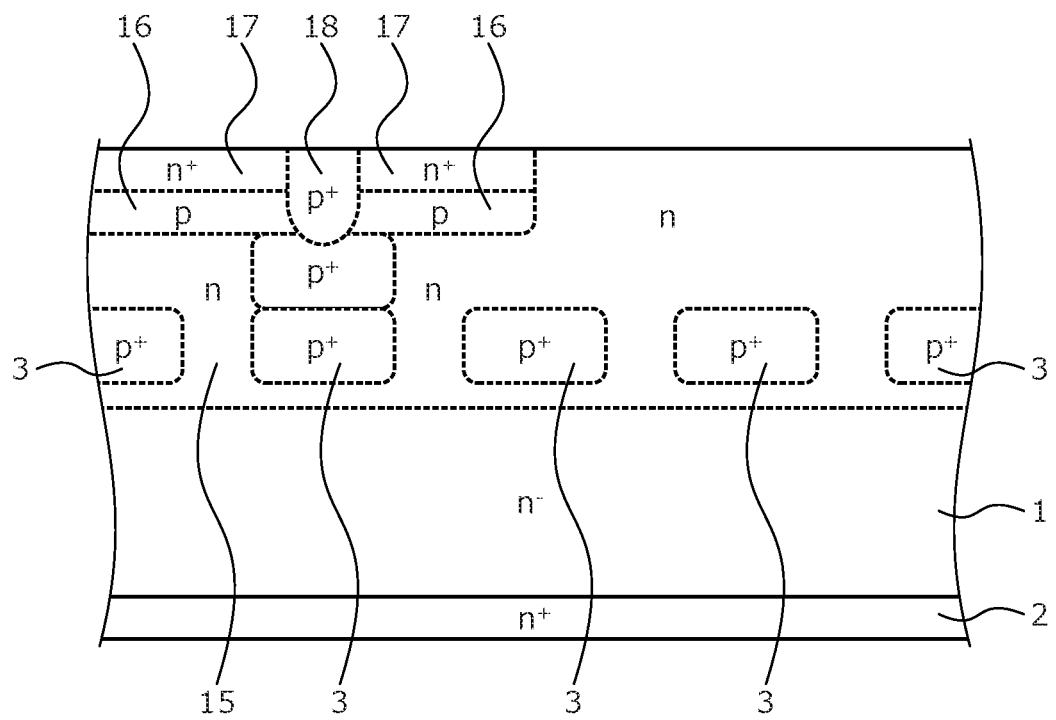
FIG. 9 is a cross-sectional view of the silicon carbide semiconductor device according to the first embodiment during manufacture.

The method of manufacturing a silicon carbide semiconductor device according to the first embodiment will be described. FIGS. 7, 8, and 9 are cross-sectional views of the silicon carbide semiconductor device according to the first embodiment during manufacture.

First, as depicted in FIG. 7, the n$^+$-type silicon carbide substrate 2 containing an n-type silicon carbide is prepared. Subsequently, the n$^-$-type silicon carbide epitaxial layer 1 containing silicon carbide is formed on a first main surface (e.g., (0001) plane, (Si face)) of the n$^+$-type silicon carbide substrate 2 by epitaxial growth while an n-type impurity (e.g., nitrogen) is doped. The n$^-$-type silicon carbide epitaxial layer 1 has an impurity concentration (e.g., about $6.0 \times 10^{15}$ to $1.0 \times 10^{16}/cm^3$) that is lower than the impurity concentration of the n$^+$-type silicon carbide substrate 2. The n$^-$-type silicon carbide epitaxial layer 1 is a low-concentration n-type drift layer doped with nitrogen and has a thickness of about 9 to 11 μm.

Next, an n-type impurity (e.g., nitrogen atoms) is ion implanted. As a result, as depicted in FIG. 7, in a surface region of the n$^-$-type silicon carbide epitaxial layer 1, the n-type high-concentration region 15 is formed at a depth of about 0.1 to 2.0 μm and has, for example, an impurity concentration of about $1.0 \times 10^{16}$ to $1.0 \times 10^{19}/cm^3$.

Next, on a surface of the n-type high-concentration region 15, a non-depicted mask having predetermined openings is formed by a photolithography technique using, for example, an oxide film. A p-type impurity (e.g., aluminum atoms) is ion implanted using the oxide film as a mask. As a result, as depicted in FIG. 7, in parts of a surface region of the n-type high-concentration region 15, the p$^+$-type region 3 is formed having for example, an impurity concentration of about $1.0 \times 10^{17}$ to $1.0 \times 10^{19}/cm^3$ and a depth of about 0.1 to 1.5 μm. Further, for example, the p$^+$-type region 3 is formed so that a distance between adjacent p$^+$-type regions 3 is about 0.5 to 1.1 μm. The state up to here is depicted in FIG. 7.

Next, on surfaces of the n-type high-concentration region 15 and the p$^-$-type regions 3, silicon carbide having an impurity concentration about a same as the impurity concentration of the n-type silicon carbide epitaxial layer 1 containing silicon carbide is deposited to about 0.1 to 1.5 μm while an n-type impurity (e.g., nitrogen) is doped. Next, an n-type impurity (e.g., nitrogen) is ion implanted. As a result, the impurity concentration of the layer of deposited silicon carbide is made to be about $1.0 \times 10^{16}$ to $1.0 \times 10^{19}/cm^3$, whereby the n-type high-concentration region 15 is formed.

Next, on a surface of the n-type high-concentration region 15, a non-depicted mask having predetermined openings is formed by a photolithography technique using, for example, an oxide film. A p-type impurity (e.g., aluminum atoms) is ion implanted using the oxide film as a mask. As a result, as depicted in FIG. 8, in parts of a surface region of the n-type high-concentration region 15, for example, an upper part of the p$^+$-type region 3 is formed having an impurity concentration of about $1.0 \times 10^{17}$ to $1.0 \times 10^{19}/cm^3$ and a depth of about 0.2 to 2.0 μm. The state up to here is depicted in FIG. 8.

Next, on the surfaces of the n-type high-concentration region 15 and the p$^+$-type regions 3, silicon carbide having an impurity concentration about a same as the impurity concentration of the n$^-$-type silicon carbide epitaxial layer 1 containing silicon carbide is deposited to about 0.1 to 1.5 μm while an n-type impurity (e.g., nitrogen) is doped.

Next, on the layer of deposited silicon carbide, a non-depicted mask having predetermined openings is formed by a photolithography technique using, for example, an oxide film. A p-type impurity (e.g., aluminum atoms) is ion implanted using the oxide film as a mask. As a result, as depicted in FIG. 9, in a part of a surface region of the layer of deposited silicon carbide, the p-type base region 16 is formed having for example, an impurity concentration of about $1.0 \times 10^{16}$ to $1.0 \times 10^{19}/cm^3$ and a depth of about 0.3 to 1.5 μm. The p-type base region 16 is formed so as to have a boundary within a width of the trench 28 that separates the region A and the region B later.

Next, on a surface of the p-type base region 16, a non-depicted mask having predetermined openings is formed by a photolithography technique using, for example, an oxide film. An n-type impurity (phosphorus (P), arsenic (As), or nitrogen) is ion implanted using the oxide film as a mask. As a result, as depicted in FIG. 9, in parts of a surface layer of the p-type base region 16, the n$^+$-type source region 17 is formed. An impurity concentration of the n$^+$-type source region 17 may be about $1.0 \times 10^{18}$ to $1.0 \times 10^{20}/cm^3$ and a depth thereof may be about 0.05 to 0.5 μm.

Next, on a surface of the n$^+$-type source region 17, a non-depicted mask having predetermined openings is formed by a photolithography technique using, for example, an oxide film. A p-type impurity (e.g., aluminum) is ion implanted using the oxide film as a mask. As a result, as depicted in FIG. 9, in a part of a surface layer of the n$^+$-type source region 17, the p$^+$-type contact region 18 is formed in electrical contact with the p$^+$-type region 3. An impurity concentration of the p$^+$-type contact region 18 may be about $1.0 \times 10^{17}$ to $1.0 \times 10^{20}/cm^3$ and a depth thereof may be about 0.2 to 2.0 μm.

Next, after a carbon film of about 0.01 to 5.0 μm is deposited on the semiconductor base surface, heat treatment (annealing) is performed, and the ion implanted impurities are activated. A temperature of the heat treatment is, for example, about 1700 to 1900 degrees C. By a single session of heat treatment as described, the ion implanted regions may be collectively activated, or the ion implanted regions may be activated by performing heat treatment each time ion implantation is performed. The state up to here is depicted in FIG. 9.

Next, a non-depicted mask having predetermined openings is formed by a photolithography technique using, for example, an oxide film. Dry etching is performed using the oxide film as a mask, whereby the trenches 28 are formed penetrating the n$^+$-type source regions 17 and the p-type base regions 16, and reaching the n-type high-concentration region 15. The bottoms of the trenches 28 are formed to reach but not penetrate through the p$^+$-type regions 3. Further, each of the trenches 28 penetrates the boundary of the p-type base region 16 and the n-type high-concentration region 15 so as to separate the region A and the region B. The width of the trenches 28 may be 0.1 to 1.5 μm, the depth thereof may be about 0.2 to 2.0 μm, and a distance between the trenches 28 may be 2 to 6 μm. Further, the distance between the trenches 28 is the cell pitch.

Next, the gate insulating film 19 is formed along surfaces of the n-type high-concentration region 15, the n$^+$-type source region 17 and the p$^+$-type contact region 18 as well as along sidewalls and bottoms of the trenches 28. The gate insulating film 19, for example, is formed by forming a High Temperature Oxide (HTO) film having a thickness of 30 nm to 200 nm by a low-pressure chemical vapor deposition (CVD) method at a temperature of about 600 to 900 degrees C.

Next, on the gate insulating film 19, for example, a polycrystalline silicon layer doped with phosphorus atoms is formed. The polycrystalline silicon layer is formed so as to be embedded in the trenches 28. Etching is performed, leaving at least ⅔ of the depth of the poly-silicon layer, thereby forming the gate electrodes 20. A part of the gate electrode 20 may protrude from the top (the source electrode pad 22 side) of the trench 28 toward the source electrode pad 22.

Next, after an oxide film is deposited to have a thickness of about 0.1 to 3.0 μm, the interlayer insulating film 21 is formed by patterning and etching. The interlayer insulating film 21 and the gate insulating film 19 are patterned and selectively removed, whereby in the region A, contact holes are formed, exposing the n$^+$-type source region 17 and the p$^+$-type contact region 18. Thereafter, heat treatment (reflow) is performed, planarizing the interlayer insulating film 21.

Next, for example, one or more among titanium (Ti), nickel (Ni), tungsten (W), and aluminum is deposited by vapor deposition or sputtering to have a total thickness of about 0.5 to 8.0 μm, patterning and etching are performed, whereby the source electrode 23 is formed in contact with the n$^+$-type source region 17 and the p$^+$-type contact region 18. Next, for example, an aluminum film is formed by, for example, sputtering so as to cover the source electrode 23 and the interlayer insulating film 21, and so as to have a thickness of, for example, about 5 μm. Thereafter, the aluminum film is selectively removed, leaving a portion of the aluminum film covering an active part of the element overall, whereby the source electrode pad 22 is formed.

Next, the interlayer insulating film 21 and the gate insulating film 19 are patterned and selectively removed, whereby in the region B, contact holes are formed, exposing the n-type high-concentration region 15. Next, a metal film containing, for example, titanium (Ti) is formed on the entire front surface of the n-type high-concentration region 15. Next, for example, heat treatment (annealing) at a temperature of about 500 degrees C. or less in a nitrogen atmosphere is performed, whereby the Schottky electrode 24 is formed in contact with the n-type high-concentration region 15.

Next, on the second main surface of the n$^+$-type silicon carbide substrate 2, the drain electrode is formed by, for example, sputtering. On the surface of the drain electrode, for example, titanium, nickel (Ni) and gold (Au) are deposited in this sequence, whereby the drain electrode pad is formed. Thus, the semiconductor device depicted in FIG. 1 is completed.

As described, according to the silicon carbide semiconductor device of the first embodiment, the region A responsible for MOSFET driving and the region B responsible for Schottky diode operation are provided. The region A has a similar structure as the MOSFET of the conventional example and therefore, the degree of difficulty of shortening cell pitch does not change. The structure between the gate trenches in the region B is simpler than the structure in the region A and therefore, shortening of the cell pitch is also easier than in the region A. This shortening of the cell pitch enables improvement of the MOSFET performance.

Further, by changing the area ratio of the region A and the region B, the ratio of MOSFET resistance and the Schottky diode resistance may be arbitrarily adjusted. Therefore, the ratio of the resistance of the forward direction of the Schottky diode and the resistance when the MOSFET is ON may be changed.

Further, the parasitic Schottky diode is provided in parallel with the parasitic pn diode between the source and the drain, enabling the parasitic Schottky diode to be turned ON before the parasitic pn diode turns ON when the MOSFET is in the OFF state. As a result, time-related degradation due to the bipolar operation of the parasitic pn diode may be prevented.

Further, the n-type high-concentration region, which is within 0.1 μm from the substrate surface, has an impurity concentration that is at least equal to the impurity concentration of the n$^-$-type silicon carbide epitaxial layer 1 and at most equal to a concentration forming an ohmic electrode. As a result, in the OFF state, the Schottky diode part is protected by the parasitic junction FET caused by a depletion layer spreading from the deep p$^+$-type region, the electric field may be mitigated and the leak current in the OFF state may be reduced.

Figure 10:
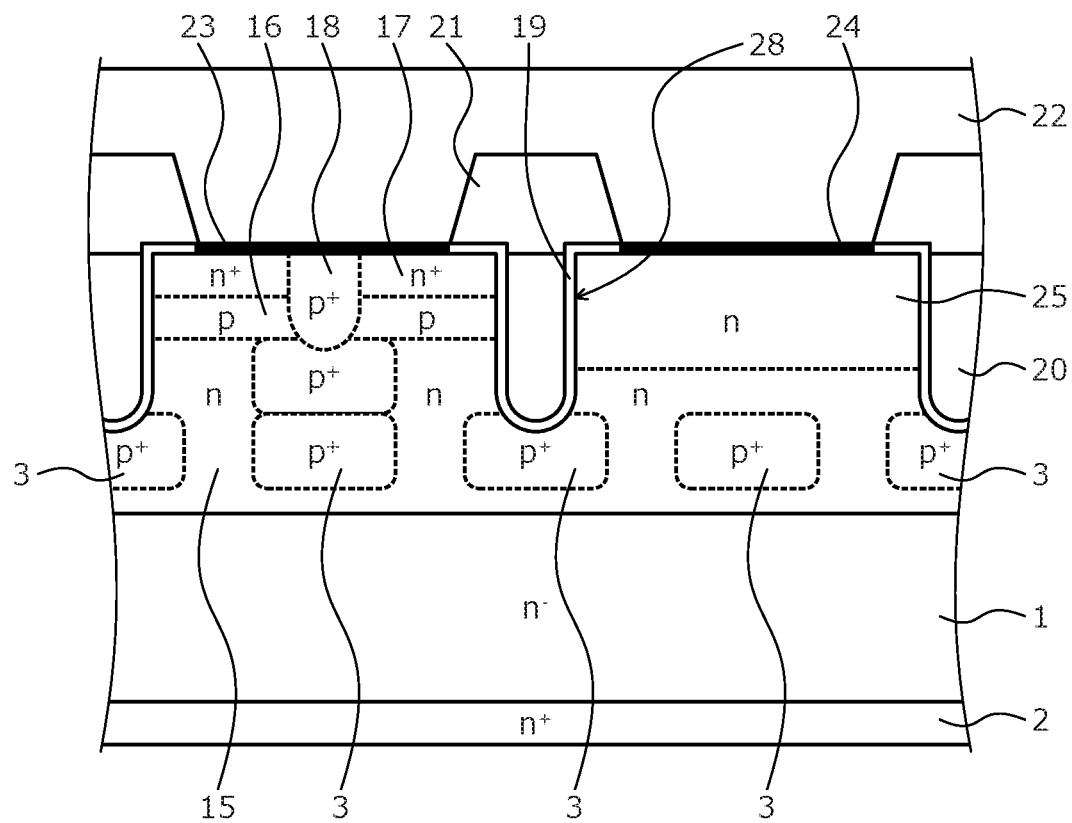
FIG. 10 is a cross-sectional view of a configuration of the silicon carbide semiconductor device according to a second embodiment.

FIG. 10 is a cross-sectional view of a configuration of the silicon carbide semiconductor device according to a second embodiment. As depicted in FIG. 10, the silicon carbide semiconductor device according to the second embodiment has a structure in which between the Schottky electrode 24 and the n-type high-concentration region 15, an n-type layer (second semiconductor layer of the first conductivity type) 25 is provided in contact with a sidewall of the trench 28.

Figure 11:
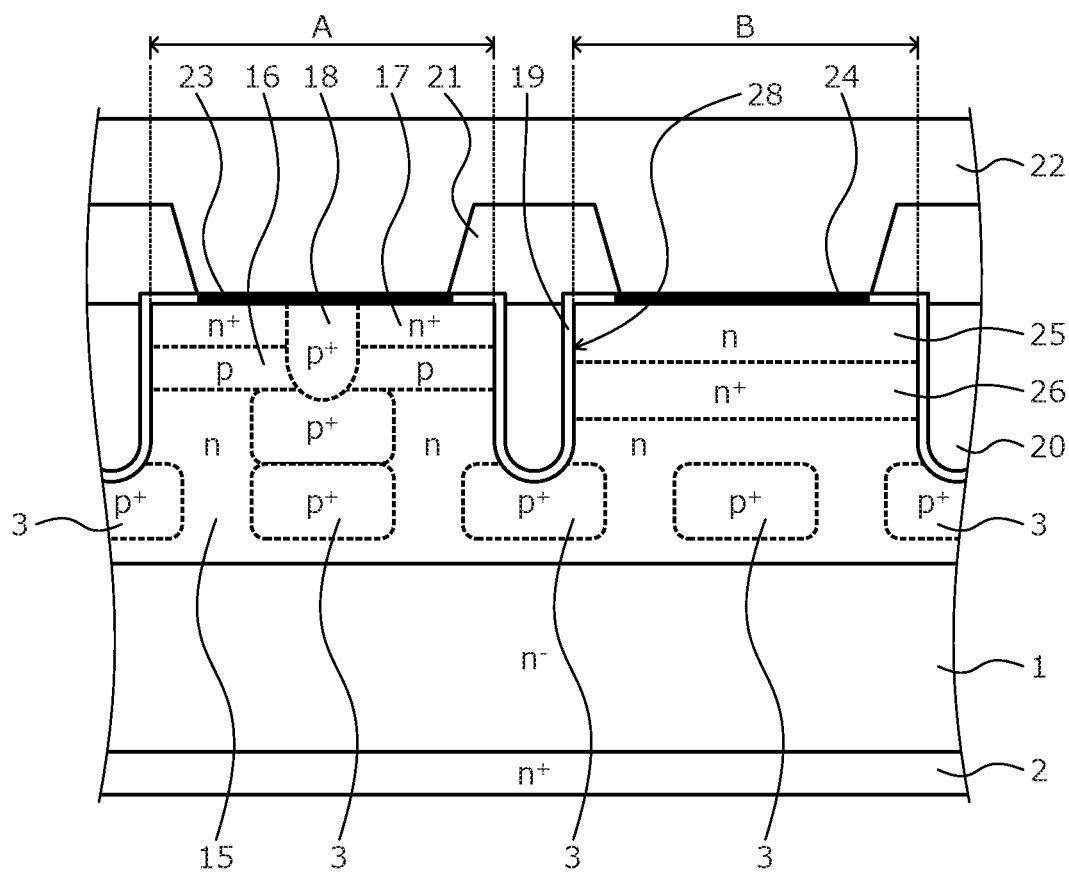
FIG. 11 is a cross-sectional view of another configuration of the silicon carbide semiconductor device according to the second embodiment.

An impurity concentration of the n-type layer 25 may be about $1.0 \times 10^{16}$ to $5.0 \times 10^{18}/cm^3$ and a depth of the n-type layer 25 may be about 0.5 to 1.6 μm, which is deeper than a depth of the p-type base region 16. FIG. 11 is a cross-sectional view of another configuration of the silicon carbide semiconductor device according to the second embodiment. As depicted in FIG. 11, the concentration of the n-type layer 25 may be distributed in the depth direction. For example, the n-type layer 25 may have a region of a high impurity concentration at a deep location like an n$^+$-type layer (third semiconductor layer of the first conductivity type) 26. The impurity concentration of the n$^+$-type layer 26 may be about $5.0 \times 10^{17}$ to $5.0 \times 10^{18}/cm^3$ and a depth of the n$^+$-type layer 26 may be about 0.05 to 0.2 μm.

Other parts of the silicon carbide semiconductor device according to the second embodiment are similar to those of the silicon carbide semiconductor device according to the first embodiment and therefore, redundant description is omitted.

Figure 12:
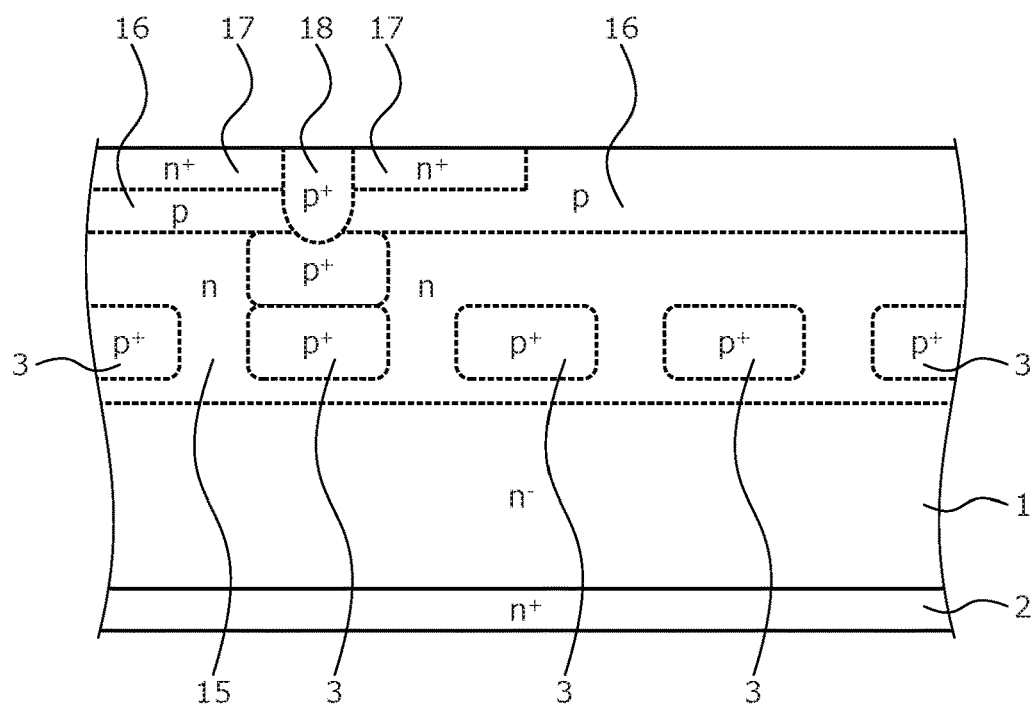
FIG. 12 is a cross-sectional view of the silicon carbide semiconductor device according to the second embodiment during manufacture.
Figure 13:
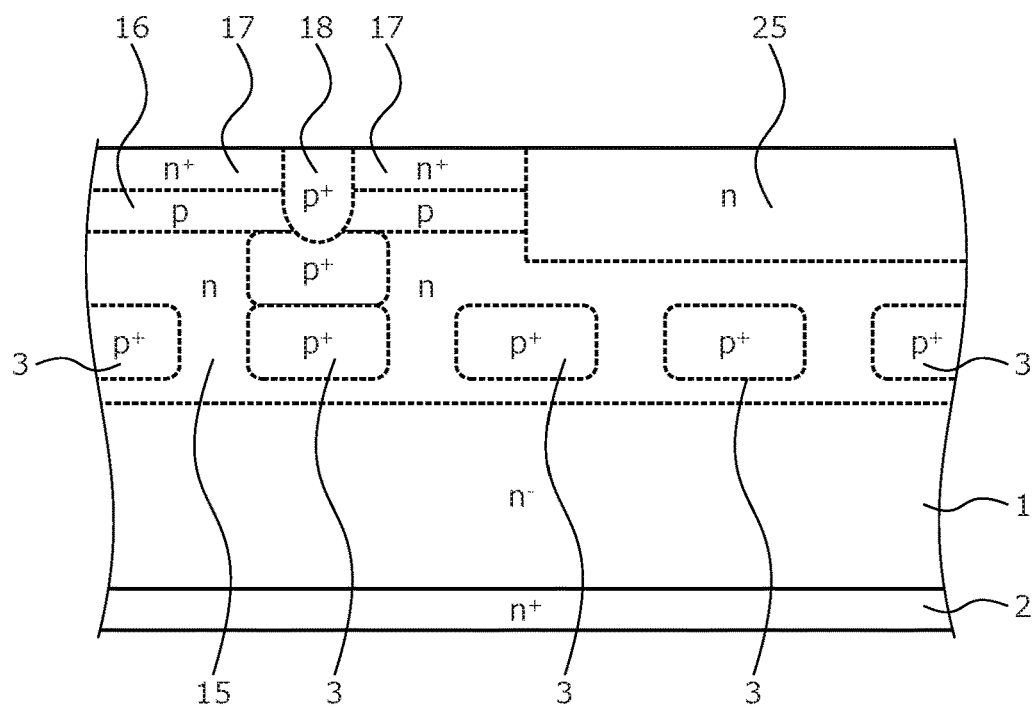
FIG. 13 is a cross-sectional view of the silicon carbide semiconductor device according to the second embodiment during manufacture.
Figure 14:
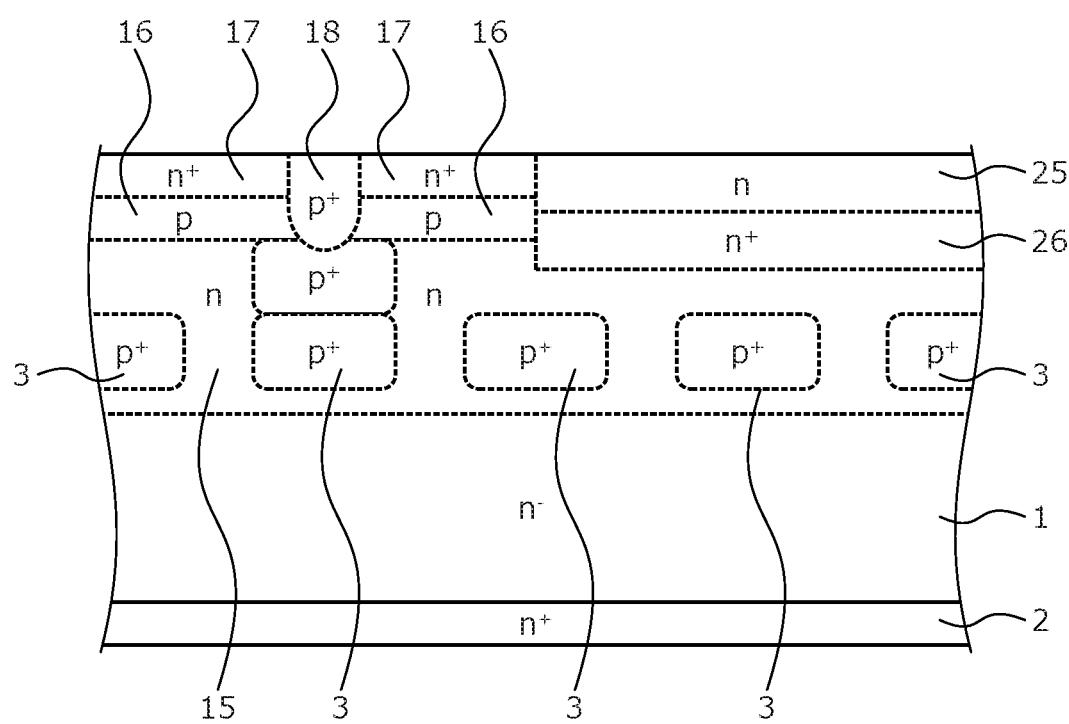
FIG. 14 is a cross-sectional view of the silicon carbide semiconductor device according to the second embodiment during manufacture.

The method of manufacturing a silicon carbide semiconductor device according to the second embodiment will be described. FIGS. 12, 13 and 14 are cross-sectional views of the silicon carbide semiconductor device according to the second embodiment during manufacture. First, similarly to the first embodiment, processes of preparing the n$^+$-type silicon carbide substrate 2 and forming the n$^-$-type silicon carbide epitaxial layer 1 by epitaxial growth to forming the upper part of the p$^+$-type regions 3 are sequentially performed (refer to FIGS. 7 and 8).

Next, on surfaces of the n-type high-concentration region 15 and the p$^+$-type regions 3, silicon carbide having an impurity concentration of about $1.0 \times 10^{16}$ to $1.0 \times 10^{19}/cm^3$ is deposited to about 0.1 to 1.5 μm while a p-type impurity (e.g., aluminum) is doped, forming the p-type base region 16. Thereafter, similarly in the first embodiment, the n$^+$-type source region 17 and the p$^+$-type contact region 18 are formed. The impurity concentration of the n$^+$-type source region 17 may be about $1.0 \times 10^{18}$ to $1.0 \times 10^{20}/cm^3$ and the depth of the n$^+$-type source region 17 may be about 0.05 to 0.5 μm. Further, an impurity concentration of the p$^+$-type contact region 18 may be about $1.0 \times 10^{17}$ to $1.0 \times 10^{26}/cm^3$ and a depth of the p$^+$-type contact region 18 may be about 0.2 to 2.0 μm. The state up to here is depicted in FIG. 12.

Next, on surfaces of the n$^+$-type source region 17, the p$^+$-type contact region 18, and the p-type base region 16, a non-depicted mask having predetermined openings is formed by a photolithography technique using, for example, an oxide film. An n-type impurity (e.g., phosphorus, arsenic, or nitrogen) is ion implanted using the oxide film as a mask. As a result, as depicted in FIG. 13, in the surface layer of the p-type base region 16, the n-type layer 25 is formed by inversion to an n-type. The impurity concentration of the n-type layer 25 may be about $1.0 \times 10^{16}$ to $5.0 \times 10^{18}/cm^3$ and the depth of the n-type layer 25 may be about 0.5 to 1.6 μm, which is deeper than the depth of the p-type base region 16. The state up to here is depicted in FIG. 13. Subsequently, similarly to the first embodiment, heat treatment (annealing) and the subsequent processes are sequentially performed, whereby the semiconductor device depicted in FIG. 10 is completed.

Further, after formation of the n-type layer 25, an n-type impurity (e.g., phosphorus, arsenic, or nitrogen) may be ion implanted, forming the n$^+$-type layer 26 in a deep region of the n-type layer 25. An impurity concentration of the n$^+$-type layer 26 may be about $5.0 \times 10^{17}$ to $5.0 \times 10^{18}/cm^3$ and a depth of the n$^+$-type layer 26 may be about 0.05 to 0.2 μm. The state up to here is depicted in FIG. 14. Subsequently, similarly to the first embodiment heat treatment (annealing) and the subsequent processes are sequentially performed, whereby the semiconductor device depicted in FIG. 11 is completed.

As described, according to the second embodiment, effects similar to those of the first embodiment may be obtained.

Figure 15:
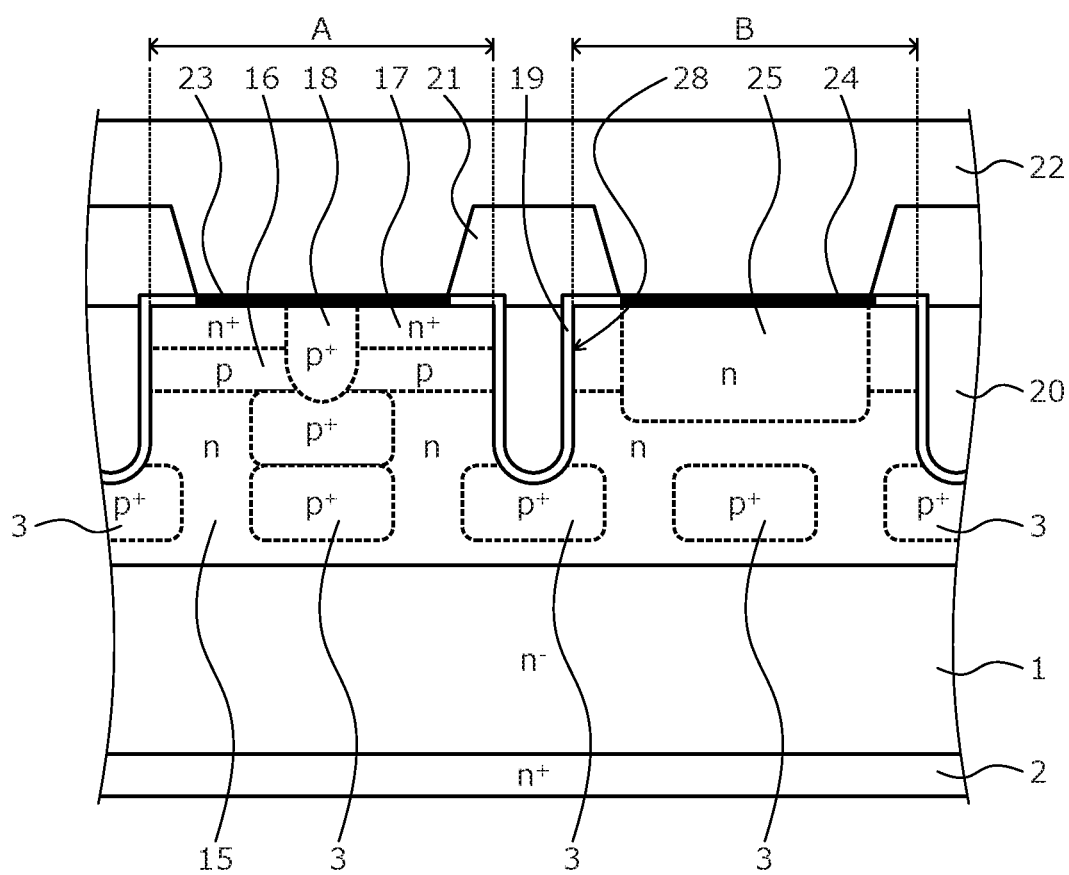
FIG. 15 is a cross-sectional view of a configuration of the silicon carbide semiconductor device according to a third embodiment.
Figure 16:
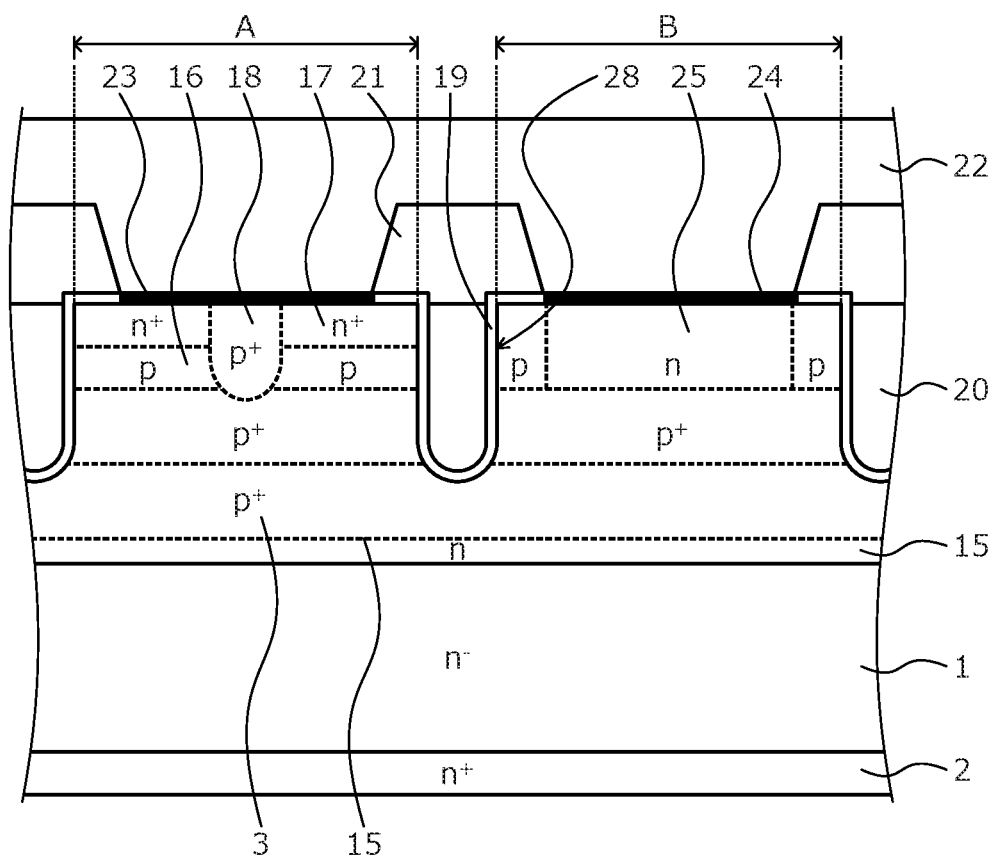
FIG. 16 is another cross-sectional view of the silicon carbide semiconductor device according to the third embodiment.

FIG. 15 is a cross-sectional view of a configuration of the silicon carbide semiconductor device according to a third embodiment. As depicted in FIG. 15, the silicon carbide semiconductor device according to the third embodiment has a structure in which the n-type layer 25 is provided between the Schottky electrode 24 and the n-type high-concentration region 15; and the p-type base region 16 is provided between the n-type layer 25 and a sidewall of the trench 28. FIG. 16 is another cross-sectional view of the silicon carbide semiconductor device according to the third embodiment. As depicted in FIG. 16, the p-type base region 16 is connected with the p$^+$-type region 3 in a longitudinal direction.

Other parts of the configuration of the silicon carbide semiconductor device according to the third embodiment are similar to those of the configuration of the silicon carbide semiconductor device according to the first embodiment and therefore, description thereof will be omitted.

Figure 17:
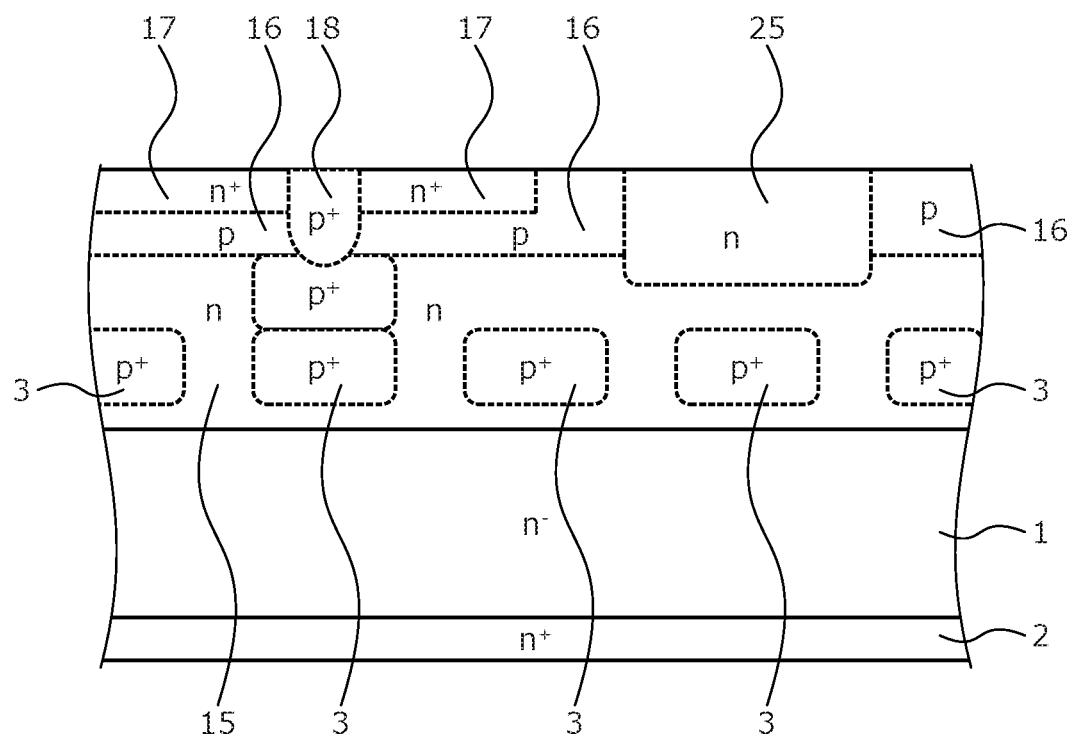
FIG. 17 is a cross-sectional view of the silicon carbide semiconductor device according to the third embodiment during manufacture.

The method of manufacturing a silicon carbide semiconductor device according to the third embodiment will be described. FIG. 17 is a cross-sectional view of the silicon carbide semiconductor device according to the third embodiment during manufacture. First, similarly to the first embodiment, the processes from the formation of the n$^+$-type silicon carbide substrate 2 and the formation of the n$^-$-type silicon carbide epitaxial layer 1 by epitaxial growth to the formation of the upper part of the part of p$^+$-type region 3 are sequentially performed (refer to FIGS. 7 and 8). Thereafter, similar to the second embodiment, the processes from the formation of the p-type base region 16 to the formation of the p$^+$-type contact region 18 are performed.

Next, on surfaces of the n$^+$-type source region 17, the p$^+$-type contact region 18, and the p-type base region 16, a non-depicted mask having predetermined openings is formed by a photolithography technique using, for example, an oxide film. An n-type impurity (e.g., phosphorus, arsenic, or nitrogen) is ion implanted using the oxide film as a mask. At this time, with respect to the trench 28 that separates the region A and the region B, a mask is formed so that a boundary of the p-type base region 16 and the n-type layer 25 is on the region B side. As depicted in FIG. 17, the mask is used to invert the surface layer of the p-type base region 16 to an n-type and form the n-type layer 25. The impurity concentration of the n-type layer 25 may be about $1.0 \times 10^{16}$ to $5.0 \times 10^{18}/cm^3$ and the depth of the n-type layer 25 may be about 0.5 to 1.6 µm, which is deeper than the p-type base region 16. The state up to here is depicted in FIG. 17. Subsequently, similarly to the first embodiment, the heat treatment (annealing) and the subsequent processes are performed, whereby the semiconductor device depicted in FIG. 16 is completed.

As described, according to the third embodiment, effects similar to those of the first embodiment may be obtained.

Figure 18:
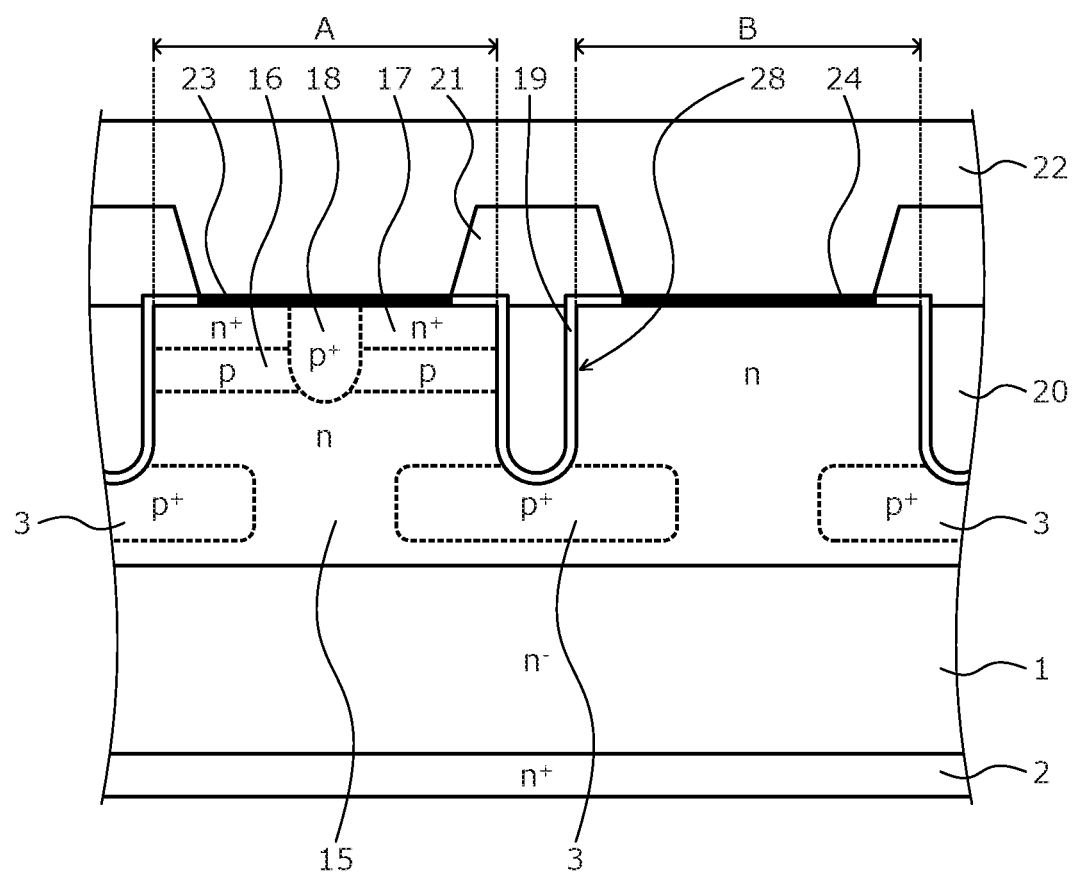
FIG. 18 is a cross-sectional view of a configuration of the silicon carbide semiconductor device according to a fourth embodiment.
Figure 19:
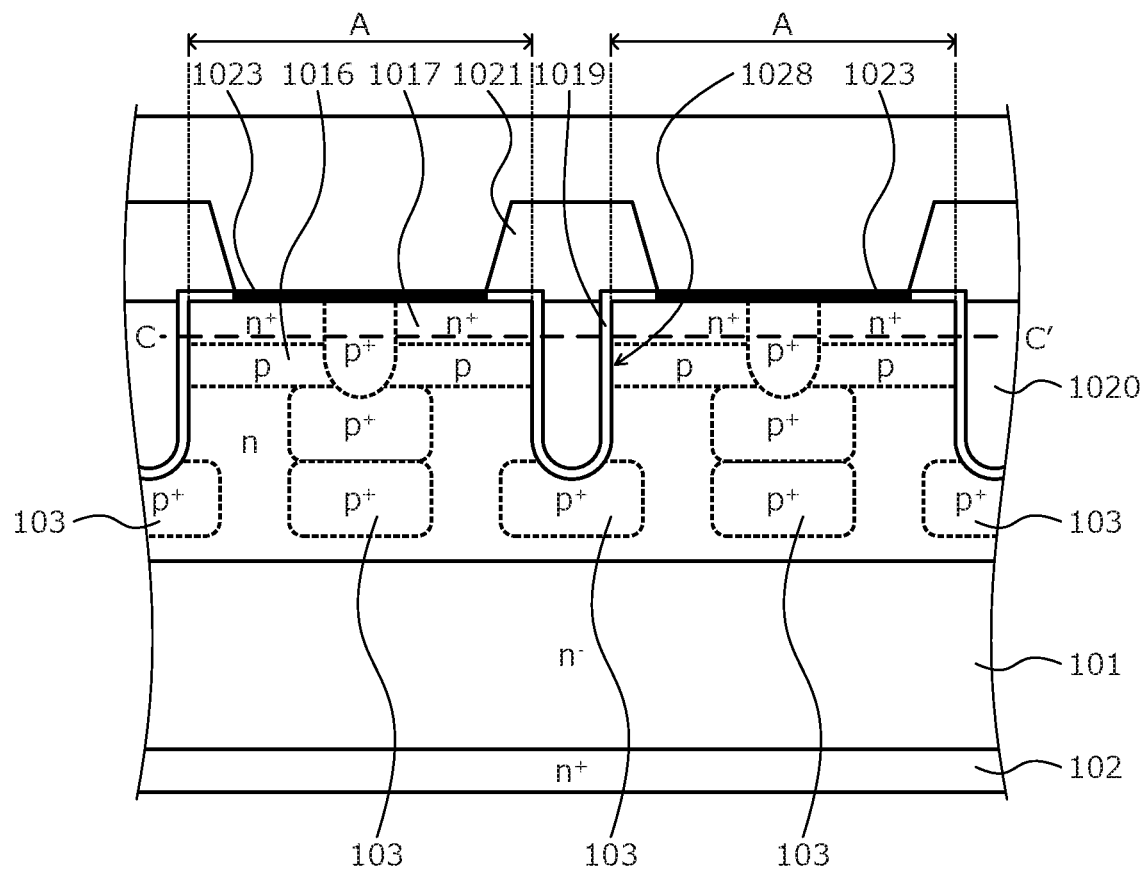
FIG. 19 is a cross-sectional view of a configuration of a conventional silicon carbide semiconductor device.
Figure 20:
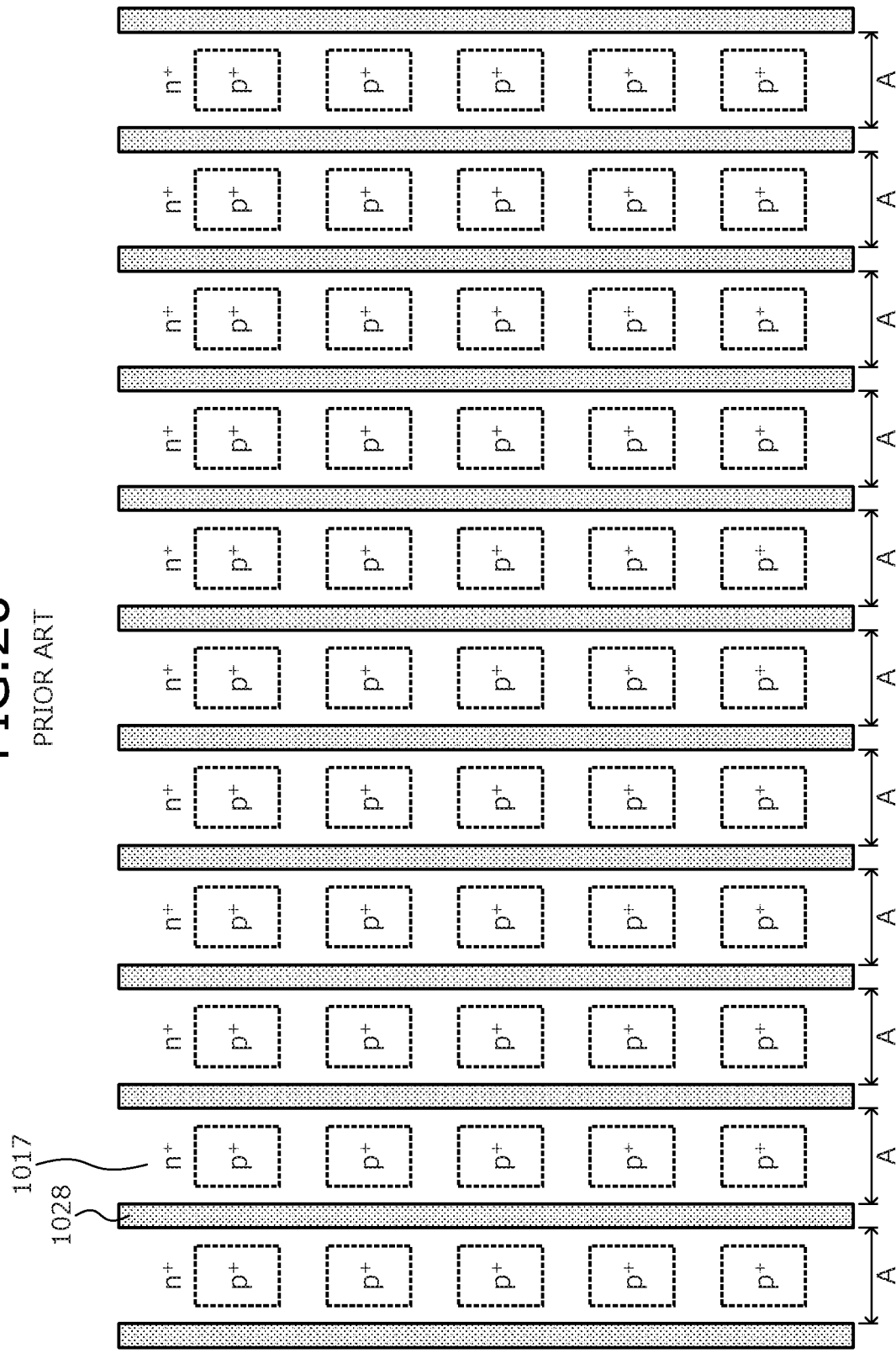
FIG. 20 is a plan view of the configuration of the conventional silicon carbide semiconductor device.

FIG. 18 is a cross-sectional view of a configuration of the silicon carbide semiconductor device according to a fourth embodiment. As depicted in FIG. 18, the silicon carbide semiconductor device according to the fourth embodiment has a structure in which the p$^+$-type region 3 in contact with the trench 28 widens to a lower part of the region B.

Other parts of the configuration of the silicon carbide semiconductor device according to the fourth embodiment are similar to those of the configuration of the silicon carbide semiconductor device according to the first embodiment and therefore, description thereof will be omitted.

The method of manufacturing a silicon carbide semiconductor device according to the fourth embodiment will be described. The silicon carbide semiconductor device according to the fourth embodiment is formed by a method similar to the method of manufacturing according to the first embodiment, where the mask when forming the p$^+$-type region 3 is wider than that in the method of manufacturing according to the first embodiment.

As described, according to the fourth embodiment, effects similar to those of the first embodiment may be obtained.

In the embodiments, various modifications within a scope not departing from the spirit of the present invention are possible. For example, dimensions, impurity concentrations, etc. of the parts may be variously set according to required specifications. Further, in the embodiments, while a MOSFET is described as an example, without limitation hereto, wide application to various silicon carbide semiconductor devices having a Schottky junction is possible. Also, in the embodiments, while the first conductivity type is assumed to be an n-type and the second conductivity type is assumed to be a p-type, the present invention is similarly implemented when the first conductivity type is a p-type and the second conductivity type is an n-type.

According to the embodiments, the region A responsible for MOSFET driving between the trenches 28 and the region B responsible for Schottky diode operation are provided. The region A has a similar structure as the MOSFET of the first conventional example and therefore, the degree of difficulty of shortening cell pitch does not change. The structure between the gate trenches in the region B is simpler than the structure in the region A and therefore, shortening of the cell pitch is also easier than in the region A. This shortening of the cell pitch enables improvement of the MOSFET performance.

Further, by changing the area ratio of the region A and the region B, the ratio of MOSFET resistance and the Schottky diode resistance may be arbitrarily adjusted. Therefore, the ratio of the resistance of the forward direction of the Schottky diode and the resistance when the MOSFET is ON may be changed.

Further, the parasitic Schottky diode is provided in parallel with the parasitic pn diode between the source and the drain, enabling the parasitic Schottky diode to be turned ON before the parasitic pn diode turns ON when the MOSFET is in the OFF state. As a result, time-related degradation due to the bipolar operation of the parasitic pn diode may be prevented.

Further, the n-type high-concentration region, which is within 0.1 µm from the substrate surface, has an impurity concentration that is at least equal to the impurity concentration of the n-type silicon carbide epitaxial layer and at most equal to a concentration forming an ohmic electrode. As a result, in the OFF state, the Schottky diode part is protected by the parasitic junction FET caused by a depletion layer spreading from the deep p$^+$-type region, the electric field may be mitigated and the leak current in the OFF state may be reduced.

The semiconductor device and the method of manufacturing a semiconductor device according to the embodiments enable time-related degradation due to the bipolar operation of the parasitic pn diode to be prevented, enable leak current to be reduced, enable improved MOSFET performance by shortened cell pitch, and enable the ratio of the resistance of the forward direction of the Schottky diode and the resistance when the MOSFET is ON to be changed.

As described, the semiconductor device and the method of manufacturing a semiconductor device according to the embodiments are useful for high-voltage power semiconductor devices used in power converting equipment and power supply devices such as in various industrial machines and are particularly suitable for silicon carbide semiconductor devices having a Schottky junction.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate of a first conductivity type;
   a first semiconductor layer provided on a front surface of the semiconductor substrate, an impurity concentration of a first sub-layer of the first semiconductor layer being lower than an impurity concentration of the semiconductor substrate;
   a first semiconductor region of a second conductivity type selectively provided in the first semiconductor layer, an impurity concentration of the first semiconductor region being higher than the impurity concentration of the first sub-layer of the first semiconductor layer;
   a second semiconductor region of the second conductivity type selectively provided in a first side of the first semiconductor layer opposite a second side of the first semiconductor layer, the second side facing the semiconductor substrate, the first sub-layer located on the second side of the first semiconductor layer, an impurity concentration of the second semiconductor region being lower than the impurity concentration of the first semiconductor region;
   a third semiconductor region of the first conductivity type selectively provided in the first semiconductor layer, an impurity concentration of the third semiconductor region being higher than the impurity concentration of the first sub-layer of the first semiconductor layer;
   a trench penetrating the third semiconductor region and the second semiconductor region, and reaching the first semiconductor region;
   a gate insulating film covering sides of the trench;
   a gate electrode provided in the trench, via the gate insulating film;
   a first electrode in contact with the first semiconductor region and the third semiconductor region; and
   a Schottky electrode in contact with a second sub-layer of the first semiconductor layer having an impurity concentration higher than the first sub-layer of the first semiconductor layer, wherein
   a first sidewall of the trench on a side where the Schottky electrode is located is in contact with the second sub-layer of the first semiconductor layer,
   a second sidewall of the trench on a side where the first electrode is located is in contact with the second semiconductor region and the third semiconductor region,
   at least a part of a region of the Schottky electrode faces the first semiconductor region in a depth direction, and
   the trench faces the first semiconductor region in the depth direction.

2. The semiconductor device according to claim 1, further comprising
   a second semiconductor layer of the first conductivity type selectively provided on the first side of the first semiconductor layer, an impurity concentration of the second semiconductor layer being higher than the impurity concentration of the first semiconductor layer, wherein
   the first sidewall of the trench one the side where the Schottky electrode is located is in contact with the second semiconductor layer, and
   the Schottky electrode is in contact with the second semiconductor layer.

3. The semiconductor device according to claim 2, further comprising
   a third semiconductor layer of the first conductivity type provided between the second sub-layer of the first semiconductor layer and the second semiconductor layer, an impurity concentration of the third semiconductor layer being higher than the impurity concentration of the second semiconductor layer, wherein
   the first sidewall of the trench on the side where the Schottky electrode is located is in contact with the second semiconductor layer and the third semiconductor layer.

4. The semiconductor device according to claim 1, wherein
   the first sidewall of the trench on the side where the Schottky electrode is located is in contact with the second sub-layer of the first semiconductor layer and the second semiconductor region.

5. The semiconductor device according to claim 1, wherein
   a first region between the trench and the first adjacent trench, where the Schottky electrode is provided, and a second region between the trench and the second adjacent trench, where the first electrode is provided, are arranged as a unit cell.

6. The semiconductor device according to claim 5, wherein
   an area of the first region is greater than an area of the second region.

7. The semiconductor device according to claim 5, wherein
   the first region and the second region are arranged in a striped shape.

8. The semiconductor device according to claim 1, wherein
   at least one part of the first semiconductor region is in contact with the trench.

9. The semiconductor device according to claim 1, wherein
   the first semiconductor region includes a trench-contacting first semiconductor region and an adjacent first semiconductor region separated from the trench-contacting first semiconductor region by a distance of 0.8 µm to 1.2 µm.

10. The semiconductor device according to claim 1, wherein
    a first side of the first semiconductor region faces the semiconductor substrate and a second side of the first semiconductor region faces the first electrode,
    the first side of the first semiconductor region is closer to the semiconductor substrate than a distance from the trench to the semiconductor substrate, and
    the second side of the first semiconductor region is separated by a distance of 0.4 µm to 1.9 µm from a surface of the third semiconductor region facing the first electrode.

11. The semiconductor device according to claim 1, wherein
    the trench includes a plurality of trenches separated from each other by a distance of at most 6 µm in a width direction and arranged at a constant interval between each pair of adjacent trenches among the plurality of trenches.

12. The semiconductor device according to claim 1, wherein an impurity concentration of the second sub-layer of the first semiconductor layer in contact with the Schottky electrode to a depth of 0.1 μm is $1.0 \times 10^{16}$ to $1.0 \times 10^{18}/cm^3$.

13. The semiconductor device according to claim 1, wherein the Schottky electrode and the first electrode are formed from a same material.

* * * * *